(12) United States Patent
Laroche et al.

(10) Patent No.: US 12,286,559 B2
(45) Date of Patent: Apr. 29, 2025

(54) METHOD FOR PLASMA DEPOSITION OF ANTI-FOG COATINGS

(71) Applicants: UNIVERSITE LAVAL, Québec (CA); UNIVERSITE TOULOUSE III-PAUL SABATIER, Toulouse (FR); CENTRE NATIONAL DE LA RECHERCHE SCIENTIFIQUE, Paris (FR); UNIVERSITE DE MONTREAL, Montréal (CA)

(72) Inventors: Gaétan Laroche, Quebec (CA); Ivan Rodriguez Duran, Madrid (ES); Luc Stafford, Montréal (CA); Julien Vallade, Saint-Jean-sur-Mayenne (FR); Antoine Durocher-Jean, Montréal (CA); Jacopo Profili, Québec (CA); Nicolas Gherardi, Ramonville Saint-Agne (FR); Raphaël Cozzolino, Toulouse (FR)

(73) Assignees: UNIVERSITÉ LAVAL, Quebec (CA); UNIVERSITÉ DE MONTREAL, Montreal (CA)

( * ) Notice: Subject to any disclaimer, the term of this patent is extended or adjusted under 35 U.S.C. 154(b) by 99 days.

(21) Appl. No.: 17/610,217

(22) PCT Filed: May 13, 2020

(86) PCT No.: PCT/CA2020/050646
§ 371 (c)(1),
(2) Date: Nov. 10, 2021

(87) PCT Pub. No.: WO2020/227828
PCT Pub. Date: Nov. 19, 2020

(65) Prior Publication Data
US 2022/0243070 A1 Aug. 4, 2022

Related U.S. Application Data

(60) Provisional application No. 62/847,474, filed on May 14, 2019.

(51) Int. Cl.
*G02B 1/18* (2015.01)
*B05D 1/00* (2006.01)
(Continued)

(52) U.S. Cl.
CPC ............... *C09D 5/00* (2013.01); *B05D 1/62* (2013.01); *C03C 17/009* (2013.01);
(Continued)

(58) Field of Classification Search
CPC .. C08J 7/054; C08J 7/056; G02B 1/18; C03C 2217/75; C23C 16/308; C23C 16/347; C23C 16/36; C23C 16/402; B05D 1/62
See application file for complete search history.

(56) References Cited

U.S. PATENT DOCUMENTS 5,487,920 A * 1/1996 Lopata .................... C23C 16/30
427/539
5,888,593 A * 3/1999 Petrmichl ............. C23C 16/513
427/574

(Continued)

FOREIGN PATENT DOCUMENTS

CH 697471 B1 * 10/2008 ............. B32B 27/36
DE 102017204525 A1 * 9/2017
(Continued)

OTHER PUBLICATIONS

Machine translation of DE 102017/204525 A1, obtained from EspaceNet.*
(Continued)

*Primary Examiner* — Z. Jim Yang
(74) *Attorney, Agent, or Firm* — NORTON ROSE FULBRIGHT CANADA LLP

(57) ABSTRACT

The present disclosure relates to anti-fog coatings, coated substrate comprising an anti-fog coating and a process for preparing such coatings. Said process comprising exposing
(Continued)

a surface to be coated in a plasma, said plasma produced by exposing a carrier gas comprising an oxidant (e.g. $N_2/O_2$, $N_2/N_2O$, or air) and a alkylcyclosiloxane (e.g. tetramethylcyclotetrasiloxane) under dielectric barrier discharge (DBD) in Townsend's mode at atmospheric pressure.

20 Claims, 18 Drawing Sheets

(51) Int. Cl.
| | |
|---|---|
| C03C 17/00 | (2006.01) |
| C03C 17/245 | (2006.01) |
| C08J 7/054 | (2020.01) |
| C08J 7/06 | (2006.01) |
| C09D 1/00 | (2006.01) |
| C09D 5/00 | (2006.01) |
| C23C 16/40 | (2006.01) |
| C23C 16/503 | (2006.01) |
| G02B 1/12 | (2006.01) |
| H05H 1/24 | (2006.01) |

(52) U.S. Cl.
CPC ............ *C03C 17/245* (2013.01); *C08J 7/054* (2020.01); *C08J 7/06* (2013.01); *C09D 1/00* (2013.01); *C23C 16/402* (2013.01); *C23C 16/503* (2013.01); *G02B 1/12* (2013.01); *G02B 1/18* (2015.01); *H05H 1/2406* (2013.01); *C03C 2217/75* (2013.01); *C03C 2218/153* (2013.01); *C08J 2323/06* (2013.01); *C08J 2367/02* (2013.01)

(56) References Cited

U.S. PATENT DOCUMENTS

| | | | | |
|---|---|---|---|---|
| 6,379,776 | B1* | 4/2002 | Tada | C03C 17/42 |
| | | | | 428/432 |
| 2006/0014050 | A1* | 1/2006 | Gueneau | B01J 35/23 |
| | | | | 428/432 |
| 2008/0102206 | A1* | 5/2008 | Wagner | C23C 16/45523 |
| | | | | 427/255.7 |
| 2009/0061237 | A1* | 3/2009 | Gates | C23C 16/56 |
| | | | | 524/81 |
| 2009/0068375 | A1* | 3/2009 | Dobbyn | C23C 4/134 |
| | | | | 427/569 |
| 2009/0263647 | A1* | 10/2009 | Gangopadhyay | C03C 17/008 |
| | | | | 428/428 |
| 2010/0092781 | A1* | 4/2010 | Zambov | C23C 16/545 |
| | | | | 428/447 |
| 2011/0189493 | A1* | 8/2011 | Ott | A61L 31/10 |
| | | | | 427/515 |
| 2011/0215445 | A1* | 9/2011 | Yang | H01L 29/00 |
| | | | | 524/588 |
| 2012/0019767 | A1* | 1/2012 | Cadet | G02B 1/18 |
| | | | | 427/164 |
| 2012/0183786 | A1* | 7/2012 | Laroche | B05D 1/62 |
| | | | | 428/447 |
| 2014/0274825 | A1* | 9/2014 | Jones | A61M 5/3134 |
| | | | | 118/723 R |
| 2016/0149159 | A1* | 5/2016 | Mori | B32B 9/00 |
| | | | | 428/446 |
| 2017/0052285 | A1* | 2/2017 | Zabeida | C23C 14/12 |
| 2017/0297164 | A1* | 10/2017 | Kim | H01L 21/67 |
| 2019/0169444 | A1* | 6/2019 | Gangakhedkar | C23C 16/405 |
| 2019/0344307 | A1* | 11/2019 | Singh | B05D 7/50 |
| 2020/0354830 | A1* | 11/2020 | Cho | H01L 21/02126 |
| 2021/0032426 | A1* | 2/2021 | Rijo Da Costa Carvalho | |
| | | | | C03C 17/30 |
| 2021/0101176 | A1* | 4/2021 | Baltazar | C23C 16/36 |
| 2021/0263195 | A1* | 8/2021 | Trottier-Lapointe | |
| | | | | C23C 14/226 |
| 2023/0350103 | A1* | 11/2023 | Tsuri | G02B 1/18 |

FOREIGN PATENT DOCUMENTS

| | | | | |
|---|---|---|---|---|
| EP | 3368299 | B1 * | 8/2019 | ............ B32B 27/08 |
| EP | 3368302 | B1 * | 8/2019 | ............ B32B 27/08 |
| WO | 2017042806 | | 3/2017 | |

OTHER PUBLICATIONS

Machine Translation of CH 697471 B1.*
Savin De Larclause et al., "Conformity of Silica-like Thin Films Deposited by Atmospheric Pressure Townsend Discharge and Transport Mechanisms." IEEE Transactions on Plasma Science. 2009. vol. 37(6), pp. 970-978.
Petersen et al., "Organosilicon Coatings Deposited in Atmospheric Pressure Townsend Discharge for Gas Barrier Purpose: Effect of Substrate Temperature on Structure and Properties." ACS Applied Materials & Interfaces. 2012. 4, pp. 5872-5882.

* cited by examiner

METHOD FOR PLASMA DEPOSITION OF ANTI-FOG COATINGS

CROSS-REFERENCE TO RELATED APPLICATIONS

The present application a U.S. National Phase of International Application No. PCT/CA2020/050646, filed on May 13, 2020, and claims benefit of U.S. Provisional Application No. 62/847,474 filed May 14, 2019, the content of which is hereby incorporated by reference in its entirety.

FIELD OF THE DISCLOSURE

The present disclosure relates to anti-fog coatings and a process for preparing such coatings.

BACKGROUND OF THE DISCLOSURE

The design of innovative transparent anti-fog coating aims to satisfy the market request that is closely linked to the necessity of improving the visibility in applications requiring light transmission features.

Fogging is a common phenomenon on glass surfaces that occurs when the temperature goes below the dew point. The condensation of moisture on the surface of the substrate leads to the formation of small and discrete droplets that cause light scattering. This undesired behaviour represents the "common state" of a typical glass surface.

Applying anti-fog films to a substrate has been employed to prevent fogging. A number of strategies rely on chemical modifications however chemical reagents and synthesis processes may not be environmentally safe or suitable to provide durable layers in the long term.

There is still therefore a need to provide innovative processes and coatings.

SUMMARY

In one aspect, there is provided a process for producing an anti-fog coating comprising
i) providing a coatable surface of a substrate;
ii) producing a plasma by exposing a carrier gas under dielectric barrier discharge (DBD) in Townsend's mode at atmospheric pressure;
iii) exposing said surface to said plasma;
wherein said carrier gas is further comprising an oxidant and a cyclic siloxane;
wherein said cyclic siloxane is of formula:

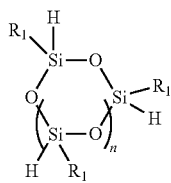

wherein each R1 is independently a straight C1-C3 alkyl, or a branched or cyclic C3 alkyl; n is the integer 1 or 2.

In a further aspect, there is provided an anti-fog coating comprising a partially carbonaceous, nitrogenated, and overoxidized silica-like composition.

In a further aspect, there is provided a coated substrate comprising a substrate and an anti-fog coating thereon, wherein said anti-fog coating is as defined herein or as prepared by a process as defined herein.

DETAILED DISCLOSURE

Figure 1A:
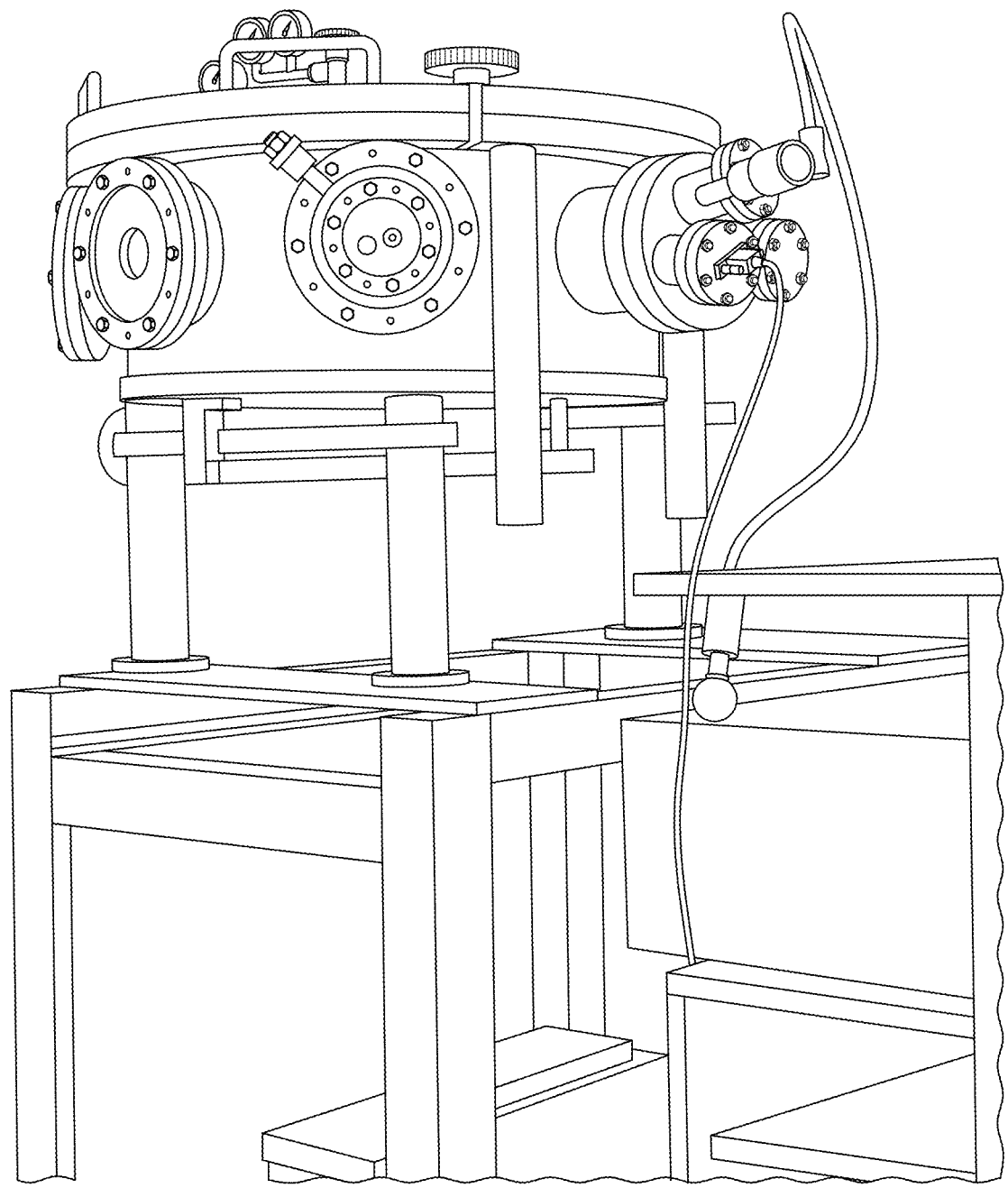
FIG. 1(a) is a representation of the DBD design used for the deposition of siloxane coatings, and (b) is a I-V characteristic of the TMCTS/$N_2O$/$N_2$ discharge.

What is contemplated herein with regard to the discharge regime is the development of a discharge between two parallel electrodes suitable to provide anti-fog coatings from an oxidant and a cyclic siloxane provided in a carrier gas.

The skilled person knows that a dielectric barrier discharge (DBD) in Townsend's mode at atmospheric pressure is characterized by a single current peak of microsecond duration per half cycle of the applied alternative voltage. The dissipated power in the discharge ranges between 0.1 and 0.7 $W\ cm^{-2}$, with applied voltages frequencies in the 3-6 kHz range. The current peak indicates ignition of the plasma. The plasma is extinguished, when the applied voltage drops under a certain threshold (i.e., breakdown voltage), which is necessary to sustain the discharge and is then reignited in the next half cycle. An appropriate plasma in accordance with this invention is homogeneous (also referred to as diffuse), that is, not creating filaments or arcs randomly distributed in time and space.

In one embodiment, the dissipated power in the discharge is at least about 0.1 $W\ cm^{-2}$, preferably at least about 0.1 $W\ cm^{-2}$, preferably at least about 0.2 $W\ cm^{-2}$, preferably at least about 0.3 $W\ cm^{-2}$, preferably at least about 0.4 $W\ cm^{-2}$, preferably at least about 0.5 $W\ cm^{-2}$, preferably at least about 0.6 $W\ cm^{-2}$, preferably about 0.7 $W\ cm^{-2}$ or from about 0.3 to about 0.7 $W\ cm^{-2}$.

In one embodiment, the dissipated power in the discharge is at least about 0.2 $W\ cm^{-2}$, in a static substrate mode.

In one embodiment, the dissipated power in the discharge is at least about 0.5 $W\ cm^{-2}$, in a non-static substrate mode.

The carrier gas and oxidant gas is a mixture leading to homogenous (or diffuse) dielectric barrier discharge in Townsend's mode at atmospheric pressure. Examples of such combinations include $N_2/O_2$, $N_2/N_2O$, and air.

In one embodiment, the carrier gas is nitrogen ($N_2$).
In one embodiment, the oxidant is nitrous oxide ($N_2O$).
In one embodiment, the carrier gas is $N_2$ and the oxidant is $N_2O$.
In one embodiment, each R1 in the cyclic siloxane is independently selected from a straight C1-C3 alkyl.
In one embodiment, each R1 in the cyclic siloxane is methyl.
In one embodiment, n in the cyclic siloxane is the integer 1.

In one embodiment, the cyclic siloxane is tetramethylcyclotetrasiloxane (TMCTS) corresponding to the formula $[H(CH_3)SiO]_4$.

In one embodiment, the carrier gas is $N_2$, the oxidant is $N_2O$ and the cyclic siloxane is tetramethylcyclotetrasiloxane (TMCTS).

In one embodiment, a ratio of $[N_2O]/[TMCTS]$ is equal to or greater than about 50% of the stochiometric ratio corresponding to the formula $[H(CH_3)SiO]_4 + 20\ N_2O \rightarrow 40\ N_2 + 4\ CO_2 + 8\ H_2O + 4\ SiO_2$.

In one embodiment, a ratio of the concentration of oxidant/concentration cyclic siloxane (such as $[N_2O]/[TMCTSD]$), (especially in non-static substrate mode) is equal to or greater than about 10, preferably equal to or greater than about 20, preferably equal to or greater than about 30, preferably equal to or greater than about 40 or preferably equal to or greater than about 50.

In one embodiment, a ratio of $[N_2O]/[TMCTS]$, (especially in non-static substrate mode) is equal to or greater than about 30, preferably equal to or greater than about 40 or preferably equal to or greater than about 50 and the dissipated power in the discharge is at least about $0.5\ W\ cm^{-2}$.

The process herein is conducted in plane-to-plane Dielectric Barrier Discharge at atmospheric pressure. The DBD design as well as the operating conditions can be varied as long as a homogeneous Townsend mode is obtained as discussed above. A typical setup comprises two metallic electrodes separated by a gas gap wherein at least of the electrodes is covered by a dielectric material. The substrate placed in the gas gap is generally non-conductive.

The substrate is not particularly limited and comprise those that would benefit from being provide anti-fog properties while not being detrimentally affected by the process described herein. The substrate may include polymers, glass, ceramics, composites and combinations thereof. Non-limiting examples of plastics include CR39 (allyl diglycol carbonate), polycarbonates, polyurethanes, polyamides, and polyesters. Non-limiting examples of glass include windows and optical elements. Non-limiting examples of ceramics include transparent armour.

In one embodiment, the substrate is glass.

In one embodiment, the substrate may be a polymer substrate including, but is not limited to, polycarbonate, polyethylene, polypropylene, polystyrene, poly(ethylene terephtalate), and Plexiglas (PMMA). For example, the polymer substrate may be a thermoplastic polymer substrate.

The coated substrate obtained in accordance with the process of the disclosure may be part of or be articles to which the coating composition can be applied are not especially limited and include optically clear articles such as protective eyewear (goggles, face shields, visors, etc.), ophthalmic lenses, automobile windshields, windows, and the like.

In one embodiment of the process, the substrate is in a static position relative to the plasma.

In one embodiment of the process, the substrate is non-static (or moveable) relative to the plasma.

In a further embodiment, the anti-fog coating is comprising a partially carbonaceous, nitrogenated, and overoxidized silica-like composition.

In one embodiment, the anti-fog coating (preferably on a substrate as defined herein) is a coating comprising a partially carbonaceous, nitrogenated and overoxidized silica-like composition, preferably characterized by the formula $Si_xO_yC_zN_w:H$ wherein $y/x>2$, preferably $<3$, more preferably within the range from 2-2.7 and $z/x>0$, preferably from 0.1-0.6; and $w/x>0$, preferably from 0.002 to less than 0.03.

In a further embodiment, the anti-fog coating is comprising a partially carbonaceous, and overoxidized silica-like composition, and wherein said coating has a root mean square ($R_{rms}$) roughness>15 under atomic force microscopy (AFM).

In a further embodiment, the anti-fog coating is comprising a partially carbonaceous, nitrogenated and overoxidized silica-like composition, and wherein said coating has a root mean square ($R_{rms}$) roughness of from about 2 to about 20 nm under atomic force microscopy (AFM).

In a further embodiment, the anti-fog coating preferably has a root mean square ($R_{rms}$) roughness of from about 2 to about 20 nm under atomic force microscopy (AFM).

In a further embodiment, the anti-fog coating has a WCA of less than about 55 degrees, preferably about 5-10 degrees.

In a further embodiment, the anti-fog coating has a WCA between about 5 degrees and about 55 degrees and preferably between about 5 degrees and about 10 degrees.

In a further embodiment, the anti-fog coating is a coating (preferably on a substrate as defined herein) comprising a partially carbonaceous and overoxidized silica-like composition, preferably characterized by the formula $Si_xO_yC_z:H$ wherein $y/x>2$, preferably $<3$, more preferably within the range from 2, 2.7 and $z/x>0$, preferably from 0.1-0.5; and wherein said coating has a root mean square ($R_{rms}$) roughness>15 under atomic force microscopy (AFM);

and wherein said coating is meeting the requirements for light transmission (in particular at least 80% light transmission after 30 seconds), while exposed to a humid atmosphere, as described in the standard ASTM 659-06 standard protocol.

In one embodiment, the anti-fog coating (preferably on a substrate as defined herein) is a coating comprising a partially carbonaceous, nitrogenated and overoxidized silica-like composition, preferably characterized by the formula $Si_xO_yC_zN_w:H$ wherein $y/x>2$, preferably $<3$, more preferably within the range from 2-2.7 and $z/x>0$, preferably from 0.1-0.6; and $w/x>0$, preferably from 0.002 to less than 0.03;

and wherein said coating preferably has a root mean square ($R_{rms}$) roughness of from about 2 to about 20 nm under atomic force microscopy (AFM);

and the anti-fog coating preferably has a WCA of less than about 55 degrees, preferably from about 5 to about 10 degrees;

and wherein said coating is meeting the requirements for light transmission (in particular at least 80% light transmission after 30 seconds), while exposed to a humid atmosphere, as described in the standard ASTM 659-06 standard protocol.

In one embodiment, the y/x ratio is greater than the one corresponding to the precursor formula $[H(CH_3)SiO]_4$ (y/x=1) and to the one of the thermal silica formula $SiO_2$ (y/x=2). In one embodiment, y/x>2.

In one embodiment, the z/x ratio is lower than the one corresponding to the precursor formula $[H(CH_3)SiO]_4$ (z/x=1) and higher than the one of the thermal silica formula $SiO_2$ (z/x=0). In one embodiment, z/x>0.

EXAMPLES

Materials and Sample Preparation

Figure 1B:
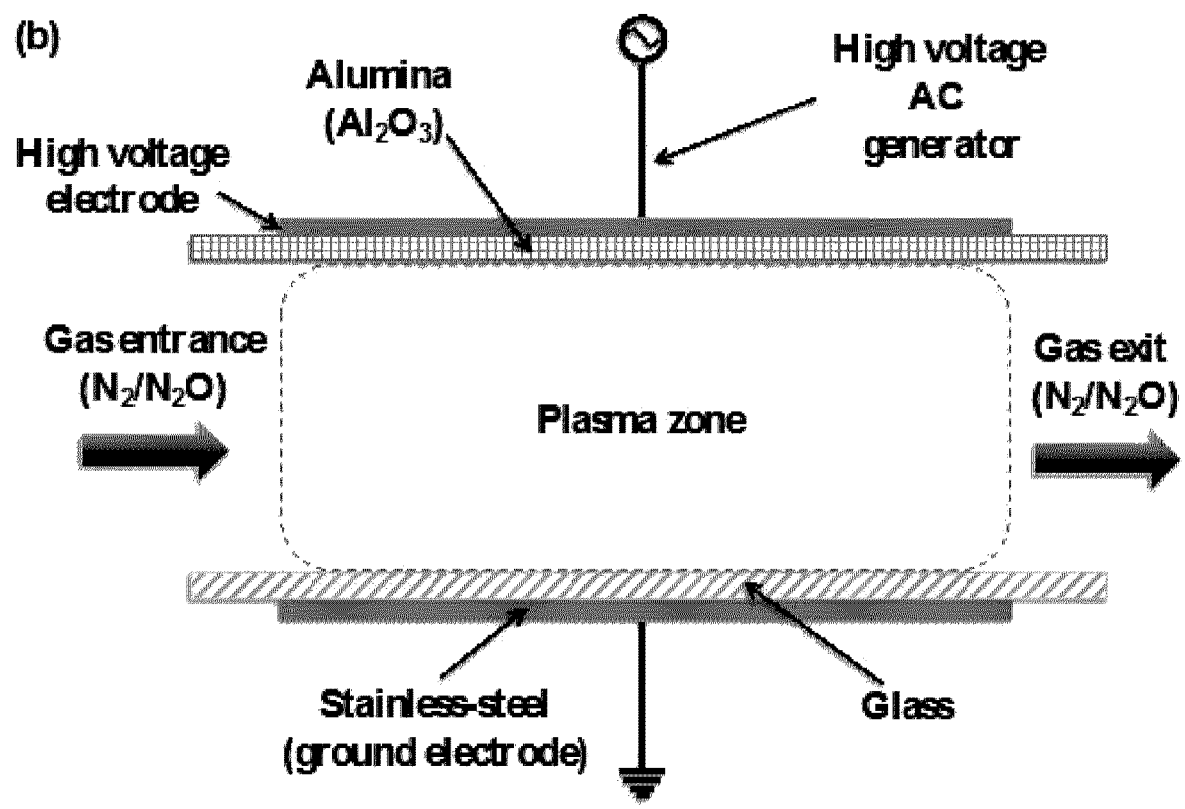

Deposition process was carried out in a custom-made parallel-plate DBD placed inside a vacuum chamber. DBD setup consists of two electrodes spaced 1 mm apart. The upper electrode is made of a dielectric plate (640-μm-thick alumina) covered with a conductive paint (silver-based) (3.5 cm×3 cm) while the bottom one is a conductive plate (stainless steel) mobile platform (13 cm×9 cm), on which glass samples were positioned prior to the deposition process (FIG. 1a). The atmospheric pressure DBD was operated in the Townsend regime with an applied voltage amplitude of approximately 16.5 $kV_{peak-to-peak}$ and a frequency of 6 kHz (FIG. 1b).

The voltage applied across the electrodes $V_{app}$ was measured by a high-voltage probe (Tektronix P6015A), while the current passing through the electric circuit $I_{meas}$ was determined by a passive oscilloscope probe (Tektronix P2200). Voltage drop across a 50Ω resistor connected in series with the ground electrode allowed for current measurements. All waveforms were recorded using a numerical oscilloscope (DPO2000, Tektronix Inc., Beaverton, OR, USA). The average power per unit area (W cm$^{-2}$) was calculated as follows:

$$P = \frac{1}{T \cdot S} \int_0^T V_{app}(t) \cdot I_{meas}(t) dt$$

where T is the period (s), S is the surface of the glass sample in contact with the plasma (cm$^2$), $V_{app}$ is the applied voltage (V), $I_{meas}$ is the measured current (A). Typical average power ranged from 0.25 to 0.7 W cm$^{-2}$. Under these conditions, it is possible to maintain glass samples close to room temperature during the deposition process.

Gas inlet was near the entry of the discharge and was composed of two independent lines, one for $N_2$ (plasma gas) and one for $N_2O$ (oxidant gas). This configuration allowed for continuous renewal of the gaseous atmosphere over the course of the deposition process. Flow rate of both gases was measured and controlled by mass flow controllers (Bronkhorst™, Ruurlo, Holland). A third line made it possible to inject the siloxane precursor using a syringe pump (Fisherbrand™, Thermo Fisher Scientific, Runcorn, Cheshire, UK) coupled to a nebulized (Mira Mist CE™, Burgener Research Inc., Mississauga, ON, Canada). The precursor was carried to the deposition zone using $N_2$ as carrier gas (aerosol).

Siloxane precursors, namely, 1,3,5,7-tetramethylcyclotetrasiloxane (TMCTS), octamethylcyclotetrasiloxane (OMCTS), 1,1,3,3-tetramethyldisiloxane (TMDSO), and hexamethyldisiloxane (HMDSO) were purchased from Sigma-Aldrich (NMR grade purity≥99.5 vol. %) and used as received without further purification. Methanol and acetone were purchased from commercial alcohols (Ontario, ON, Canada) and Laboratories MAT (Québec, QC, Canada), respectively. Nitrogen ($N_2$, grade 4.8) and nitrous oxide ($N_2O$, 99.998%) were provided by Linde (Québec, QC, Canada). Glass samples measuring 13 cm×5 cm×2 mm were provided by Multiver Ltd (Québec, QC, Canada). PolyEthylene Terephthalate (PET) and Low-Density PolyEthylene (LDPE) samples measuring 50 cm×15 cm×0.1 mm were provided by GoodFellow (Lille, France)

Prior to the deposition process, glass samples were ultrasonically cleaned in acetone for 10 min followed by rinsing in methanol and deionized water to remove any organic remnant. The as-treated glasses were ultrasonically washed for 10 min with deionized water and then wiped dry with a cotton cloth (Amplitude Kappa™, Contect Inc., Spartanburg, SC, USA). Afterwards, glass samples were immersed in a piranha solution ($H_2SO_4$:$H_2O_2$, 3:1 v/v %) for 10 min to generate reactive Si—OH on the surface (surface activation), rinsed with abundant deionized water, and dried with a dry air jet. For PolyEthylene Terephthalate (PET) and Low-Density PolyEthylene (LDPE) samples, no surface pretreatment was realized.

Chemical surface composition of coated glasses was determined by X-ray photoelectron spectroscopy (XPS) on a PHI 5600-ci spectrometer (Physical Electronics, Chanhassen, MN, USA) operated under high vacuum (<10$^{-6}$ Pa). A standard Al X-ray source ($K_\alpha$, hv=1486.6 eV) at 300 W was used to record survey spectra (0-1400 eV), while a standard Mg X-ray source ($K_\alpha$, hv=1253.6 eV) at 300 W was used to record high-resolution spectra (HRXPS). Photoelectron detection was carried out at a take-off angle of 45° and surface charging effects were compensated by setting the C—C/C—H aliphatic carbon binding energy peak at 285.0 eV. The analyzed area was approximately 0.005 cm$^2$ for all samples. By means of the least squares fitting, curve fitting of C1s and Si2p features was performed using Gaussian-Lorentzian functions, following Shirley-type background subtraction (PHI MultiPak™ software v 9.3). Nine analyses per sample were carried out to evaluate the chemical homogeneity of coated glasses and provide a mean value with its corresponding standard deviation.

Infrared spectra were acquired using a 45-degree incident ATR accessory (1.5 mm$^2$ active sample area, Si crystal with a depth of penetration at 1000 cm$^{-1}$ of 0.81 μm for $n_{sample}$=1.5) in the 400-4000 cm$^{-1}$ range (mid-IR) on a FTIR spectrophotometer (Cary 660 FTIR, Agilent Technologies, Victoria, Australia) equipped with a DLaTGS detector, a Ge-coated KBr beamsplitter (Harrick Scientific Products, Pleasantville, NY, USA) and a Split-Pea accessory (Harrick Scientific Products, Pleasantville, NY, USA). Spectra were recorded at room temperature with a resolution of 4 cm$^{-1}$ and 128 scans. For each coating, nine equally spaced points were analyzed from the gas entrance side to the exhaust side. Using Origin software (Origin Lab Corp. v 8.5), spectral features were normalized with respect to the asymmetric Si—O—Si stretch vibration band, $v_a$ Si—O—Si (1000-1200 cm$^{-1}$) following baseline correction.

Nanoscale topography of coated glasses was investigated on an atomic force microscope (Dimension 3100, Veeco Digital Instruments by Bruker, Santa Barbara, CA, USA) operated in the tapping mode under ambient conditions. A silicon tip (OTESPA probe, Bruker Nano Surface Division, Santa Barbara, CA, USA) with a radius of curvature<10 nm and an aspect ratio of approximately 1.6/1 was used to scan the surface (scan angle 90°). AFM images were recorded at a scan rate of 0.5 Hz with a line resolution of 256×256 and flattened using a first order line fit (NanoScope Analysis software v 1.5 by Bruker). Surface roughness was evaluated on 5×5 (tip velocity=5 μm s$^{-1}$) and 50×50 μm$^2$ (tip velocity=50 μm s$^{-1}$) areas, and characterized by two roughness parameters, namely the root mean square roughness ($R_{rms}$) and the mean roughness ($R_a$).

Figure 2A:
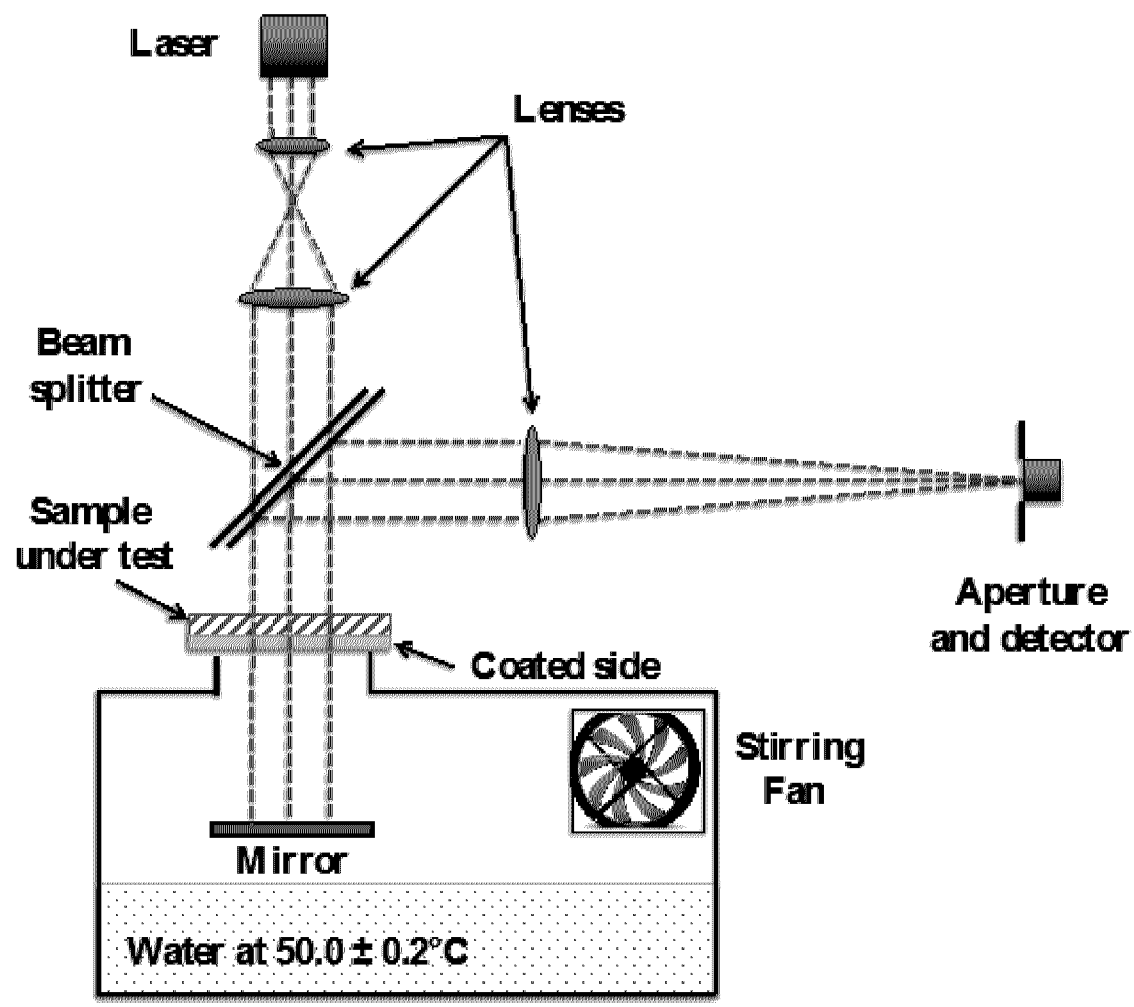
FIGS. 2(a), (b) and (c) are a representation of the designs used in the assessment of fogging.
Figure 2B:
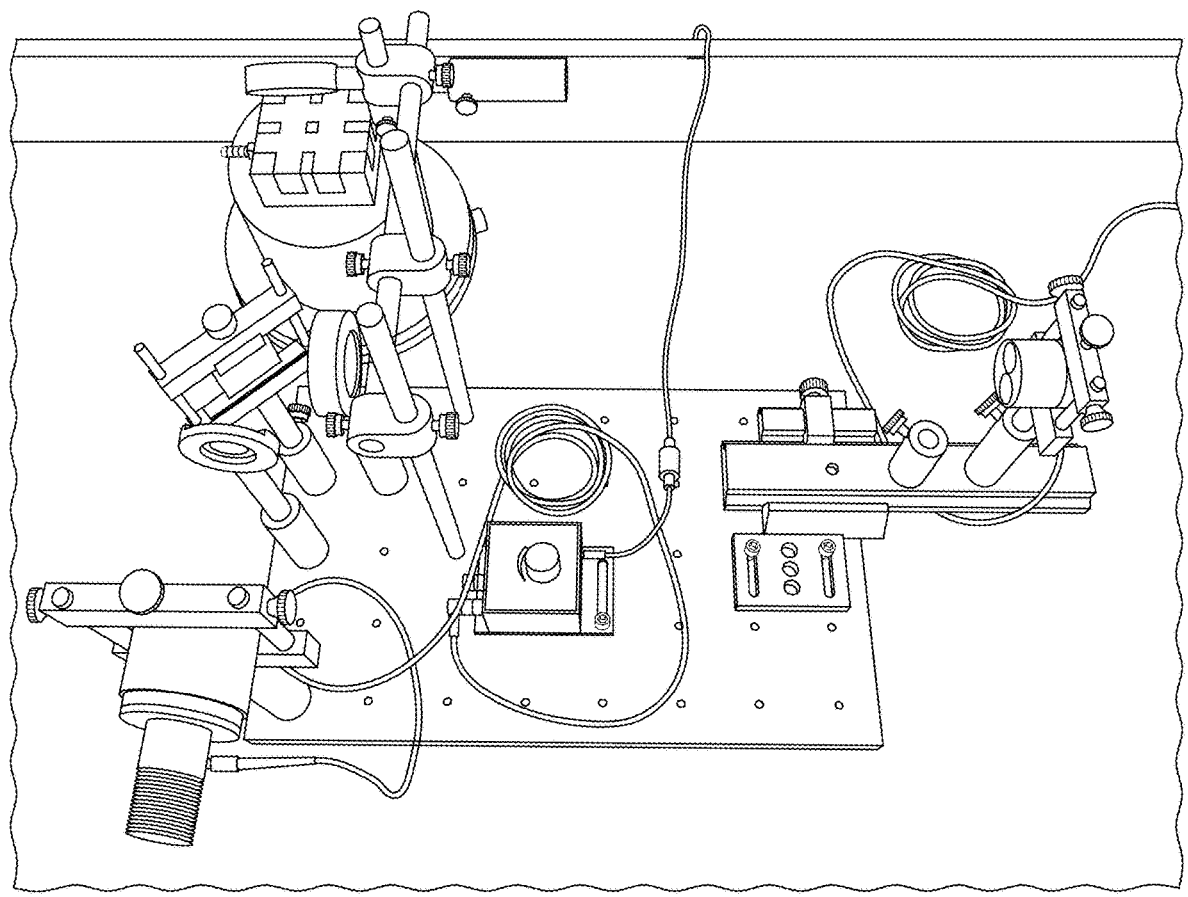
Figure 2C:
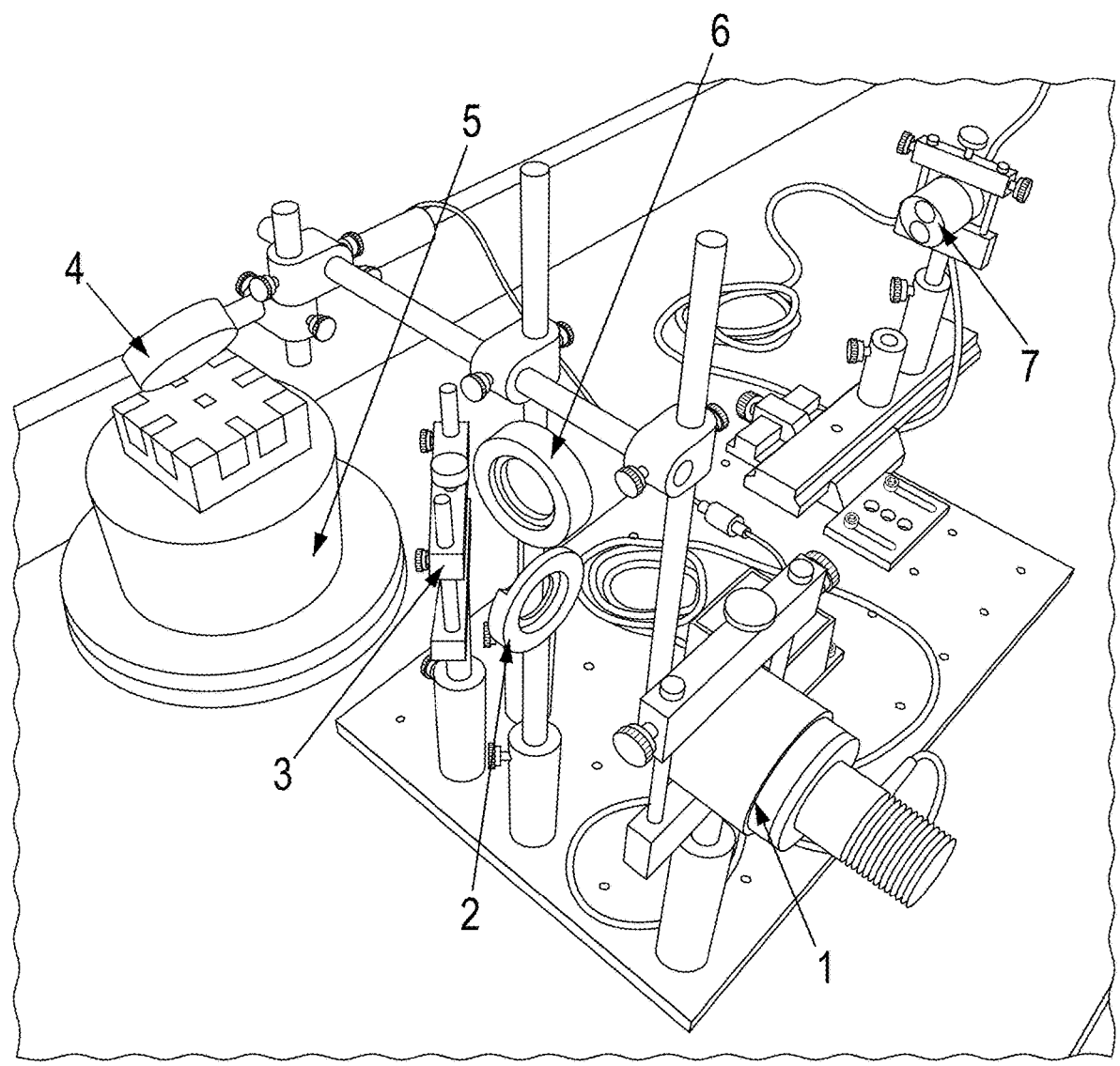

A modified version of standard test method ASTM F 659-06 (FIG. 2(a)) was used to assess the resistance to fogging of coated glasses (FIG. 2(b)). In FIG. 2(b), the setup is showing: (1) light-emitting diode, LED (590 nm), (2) diaphragm, (3) beam splitter, (4) mirror, (5) mirror inside the water bath as depicted in FIG. 2(a), (6) converging lenses, and (7) photodetector. Briefly, coated glasses were first immersed in distilled water at 23° C. for 1 h and then air dried at room temperature for at least 12 h. Afterwards, coated glasses were placed over a bath containing water at 50° C. and exposed to light of wavelength 590 nm to record the light transmission as a function of time for a maximum of 1200 s. For a surface to be anti-fogging, the F 659-06 standard states that the percentage of light transmitted through the sample must be equal or greater than 80% following 30 s of exposure to water vapor at 50° C. The anti-fogging performance was also tested under more aggressive fogging conditions by placing the coated glasses on an Erlenmeyer flask containing water at 80° C. for 15 s.

The wetting behavior of the coatings was assessed by contact angle measurements, in particular using the sessile drop method. Briefly, 3 μL of ultrapure water was dropped from a height of 1 cm (to ensure consistency in contact angle measurements) and water contact angles (WCA) were measured following the pinning of the three-phase contact (TPC) line (i.e., where gas, liquid, and solid phases meet) using a Video Contact Angle System (VCA-2500 XETM, AST products Inc., Billerica, MA, USA) equipped with a high-resolution CCD camera. Ten water drops were placed at different locations on the coating surface to measure eighteen contact angles (two WCA on each side of the drop), and thus provide an average WCA value with its corresponding standard deviation.

Example 1) Plasma Deposition for Various TMCTS Precursor Concentration Fractions and Various Oxidant-to-Precursor Ratios A first series of measurements were carried out using various TMCTS precursor concentration fractions and oxidant-to-precursor ratios. Here, a total flow rate of $N_2$ was set at 7.5 L min$^{-1}$, while TMCTS concentrations ranged from 3 to 18 ppm. [$N_2O$]/[TMCTS] ratios of 10 (sub-stoichiometric ratio) and 30 (over-stoichiometric ratio) were also chosen according to the stoichiometric equation discussed above. All conditions are summarized in Table 1. The discharge was driven at 14 kV$_{peak-to-peak}$ at a frequency of 3 kHz, which corresponds to an average power per unit area of 0.245 W cm$^{-2}$. Coatings were deposited in static mode (no displacement of the substrate) for 20 minutes.

TABLE 1

Deposition parameters (ppm: parts per million, R = [$N_2O$]/[TMCTS], S = [$N_2O$] + [TMCTS]).

| Coating | TMCTS (ppm) | $N_2O$ (ppm) | R | S (ppm) |
|---------|-------------|--------------|-----|---------|
| A | 9.0 | 91.0 | 10 | 100 |
| B | 3.2 | 96.8 | 30 | 100 |
| C | 6.5 | 193.5 | 30 | 200 |
| D | 18.0 | 182.0 | 10 | 200 |

In order to quantify the anti-fogging performance of samples shown in Table 1, the light transmission as a function of time was monitored, while exposed to a humid atmosphere, as described in the standard ASTM 659-06 standard protocol. All samples displayed the same overall trend characterized by a noticeable decay of the light transmittance in the first seconds caused by a light scattering of nucleated water drops. This decay can be quantified by fitting an exponential mathematical function with lower decay values (constant decay, k) corresponding to better anti-fog properties. As time goes on, the light response exhibits a slow recovery, presumably due to the growth of water drops by coalescence and formation of a water layer on the surface.

TABLE 2

Surface composition of plasma-deposited coatings as a function of the position.

| Coating | Position | C1s | O1s | Si2p | N1s | O/Si | C/Si |
|---------|----------|------|------|------|------|------|------|
| A | Entrance | 20.6 ± 0.5 | 52.4 ± 0.4 | 24.4 ± 0.3 | 2.6 ± 0.3 | 2.14 ± 0.04 | 0.84 ± 0.03 |
|   | Middle   | 19.4 ± 0.3 | 53.4 ± 0.6 | 24.5 ± 0.2 | 2.7 ± 0.1 | 2.17 ± 0.04 | 0.79 ± 0.02 |
|   | Exit     | 19.2 ± 0.5 | 54.3 ± 0.3 | 23.9 ± 0.4 | 2.6 ± 0.2 | 2.27 ± 0.05 | 0.80 ± 0.03 |
| B | Entrance | 9.5 ± 0.3 | 65.2 ± 0.4 | 24.7 ± 0.5 | 0.6 ± 0.1 | 2.64 ± 0.07 | 0.38 ± 0.02 |
|   | Middle   | 8.1 ± 0.6 | 66.8 ± 0.4 | 24.5 ± 0.7 | 0.6 ± 0.2 | 2.73 ± 0.09 | 0.33 ± 0.03 |
|   | Exit     | 7.9 ± 0.4 | 66.3 ± 0.6 | 25.3 ± 0.4 | 0.5 ± 0.1 | 2.72 ± 0.07 | 0.31 ± 0.02 |
| TMCTS | — | 33.3 | 33.3 | 33.3 | — | 1 | 1 |

Table 3 summarizes the characteristic anti-fog parameters. As will be seen, both coatings A (R=10) and B (R=30) provide antifog effects at O/Si ratios of 2.2 as well as 2.7.

TABLE 3

Light transmission parameters and water contact angles (WCA) of the coated glasses under fogging testing.

| Coating | k (s$^{-1}$) | Transmittance at 30 s (%) | WCA (deg.) |
|---------|-------------|---------------------------|------------|
| B (R = 30, S = 100) | 0.12 ± 0.01 | 93.4 | 5-10 |
| C (R = 30, S = 200) | 0.20 ± 0.01 | 93.2 | 5-10 |
| A (R = 10, S = 100) | 0.38 ± 0.03 | 67.8 | 62 ± 4 |
| D (R = 10, S = 200) | 0.44 ± 0.02 | 66.2 | 55 ± 5 |
| Uncoated glass | 0.85 ± 0.03 | 61.4 | 72 ± 2 |

As shown in Table 3, the worst anti-fogging performance was observed in the bare glass sample with only 61.4% of light transmittance remaining after 30 s, whereas the best anti-fogging coating was found in the sample B and C with a 93% of light transmission remaining after 30 s. This test clearly reveals that TMCTS-based coatings provides glass samples with the anti-fogging feature.

Example 2) Plasma Deposition for Various Organosilicon Precursors

In the following examples, OMCTS, TMDSO, and HMDSO are used as comparative examples to TMCTS. Here, the total flow rate of $N_2$ was set at 4 L min$^{-1}$ and the precursor concentration was set at 10 ppm. In all experiments, the [$N_2O$]/[precursor] ratio in the discharge was 50% greater than the stoichiometric one (Table 4). Stoichiometric [$N_2O$]/[precursor] ratios were calculated assuming the following reactions between the siloxane precursors and the $N_2O$ in the discharge:

TMCTS: $[H(CH_3)SiO]_4 + 20\ N_2O \rightarrow 20\ N_2 + 4\ CO_2 + 8\ H_2O + 4\ SiO_2$ OMCTS: $[(CH_3)_2SiO]_4 + 32\ N_2O \rightarrow 32\ N_2 + 8\ CO_2 + 12\ H_2O + 4\ SiO_2$ TMDSO: $H_2(CH_3)_2Si_2O + 18\ N_2O \rightarrow 18\ N_2 + 4\ CO_2 + 7\ H_2O + 2\ SiO_2$ HMDSO: $(CH_3)_3Si_2O + 24\ N_2O \rightarrow 24\ N_2 + 6\ CO_2 + 9\ H_2O + 2\ SiO_2$

TABLE 4

Amount of oxidant and precursor injected in the discharge.
[X] indicates concentration of X.

| | [Precursor] (ppm) | [N$_2$O] (ppm) | [N$_2$O]/[precursor] |
|---|---|---|---|
| TMCTS | 10 | 300 | 30 |
| OMCTS (comparative example) | 10 | 480 | 48 |
| TMDSO (comparative example) | 10 | 270 | 27 |
| HMDSO (comparative example) | 10 | 360 | 36 |

The discharge was driven at 16.5 kV$_{peak-to-peak}$ at a frequency of 6 kHz, which corresponds to a discharge power of 0.7 W cm$^{-2}$. The deposition time was set at 10 min. The scroll speed of glass samples was kept at 35 cm min$^{-1}$, i.e., the bottom electrode moving back and forth 50 times.

Table 5 shows the chemical composition of the coating in terms of atomic percent (at. %) of Si, C, O, N, as well as O/Si and C/Si atomic ratios, as determined by XPS survey analysis. Plasma deposition carried out under conditions of over-stoichiometric [N$_2$O]/[precursor] ratio resulted in coatings with much less carbon and more oxygen, when compared with the theoretical composition of siloxane precursors. TMCTS revealed the higher oxygen-to-silicon ratio, with a value close to 2.4, in addition to exhibiting the lowest carbon-to-silicon ratio, with a value close to 0.18.

TABLE 5

Surface composition of the coatings.

| Sample | Si2p | O1s | C1s | N1s | O/Si | C/Si |
|---|---|---|---|---|---|---|
| TMCTS* | 33.3 | 33.3 | 33.3 | — | 1 | 1 |
| TMCTS | 27.9 ± 0.8 | 67.0 ± 0.6 | 5 ± 1 | 0.1 ± 0.2 | 2.40 ± 0.07 | 0.18 ± 0.04 |
| OMCTS* | 25 | 25 | 50 | — | 1 | 2 |
| OMCTS | 28.7 ± 0.6 | 64.9 ± 0.7 | 6.5 ± 0.8 | — | 2.26 ± 0.06 | 0.23 ± 0.03 |
| TMDSO* | 28.6 | 14.3 | 57.1 | — | 0.5 | 2 |
| TMDSO | 28.4 ± 0.6 | 63.9 ± 0.7 | 7.6 ± 0.7 | 0.08 ± 0.08 | 2.25 ± 0.06 | 0.27 ± 0.03 |
| HMDSO* | 22.2 | 11.1 | 66.7 | — | 0.5 | 3 |
| HMDSO | 27.8 ± 0.3 | 66.0 ± 1.0 | 6.0 ± 1.0 | — | 2.38 ± 0.05 | 0.20 ± 0.05 |

*Chemical composition of siloxane precursors.

With regard to 0/Si ratios, it is worth highlighting that the values are always above 2, i.e. higher than the one expected from thermal silica (SiO$_2$). This result is consistent with the presence of silanol groups in the coatings, as revealed by the FTIR analyses shown below.

FIG. 3 shows the infrared spectra of liquid precursors and their associated plasma-deposited coatings. The main absorption features for TMCTS, OMCTS, TMDSO, and HMDSO are assigned in Table 6.

Figure 3A:
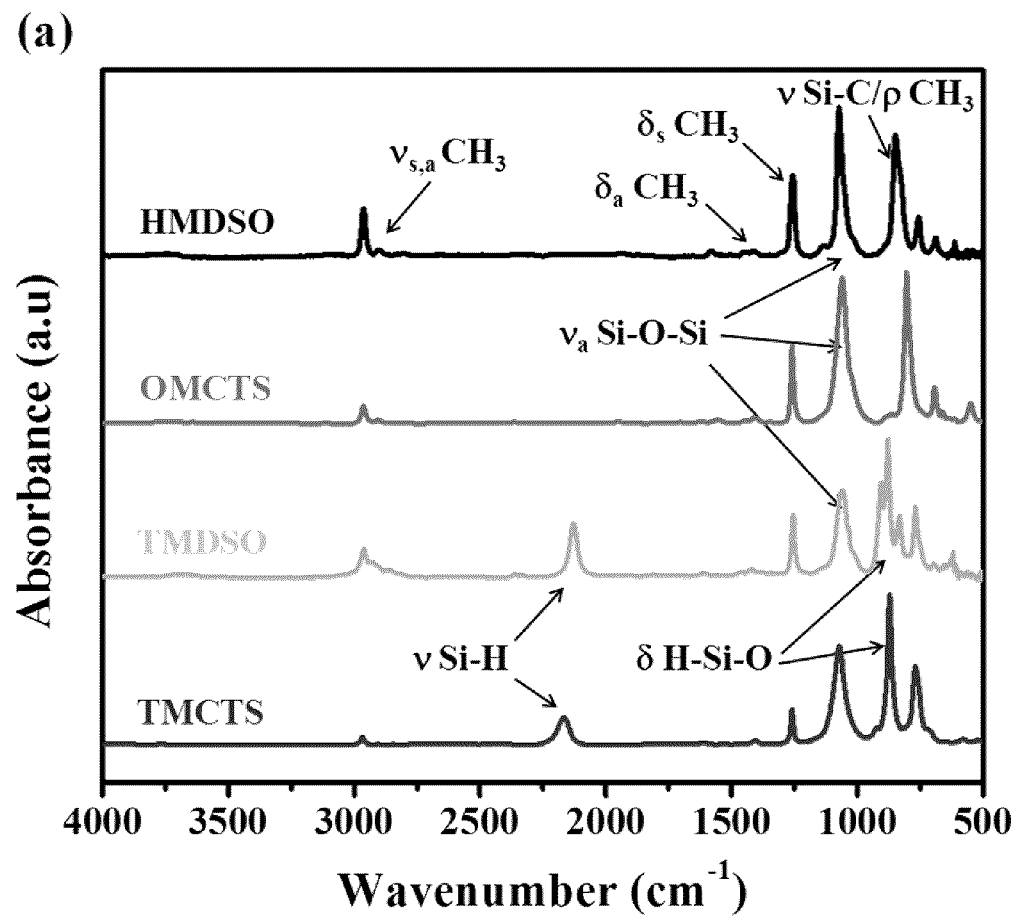
FIG. 3(a) ATR-FTIR spectra of liquid precursors and (b) plasma deposited coatings in the 4000-500 $cm^{-1}$ range. Detail of the (c) 1300-700 $cm^{-1}$ and (d) 3800-2600 $cm^{-1}$ regions showing the main IR spectral features (ν=stretching, δ=bending, ρ=rocking, a=asymmetric, and s=symmetric)
Figure 3B:
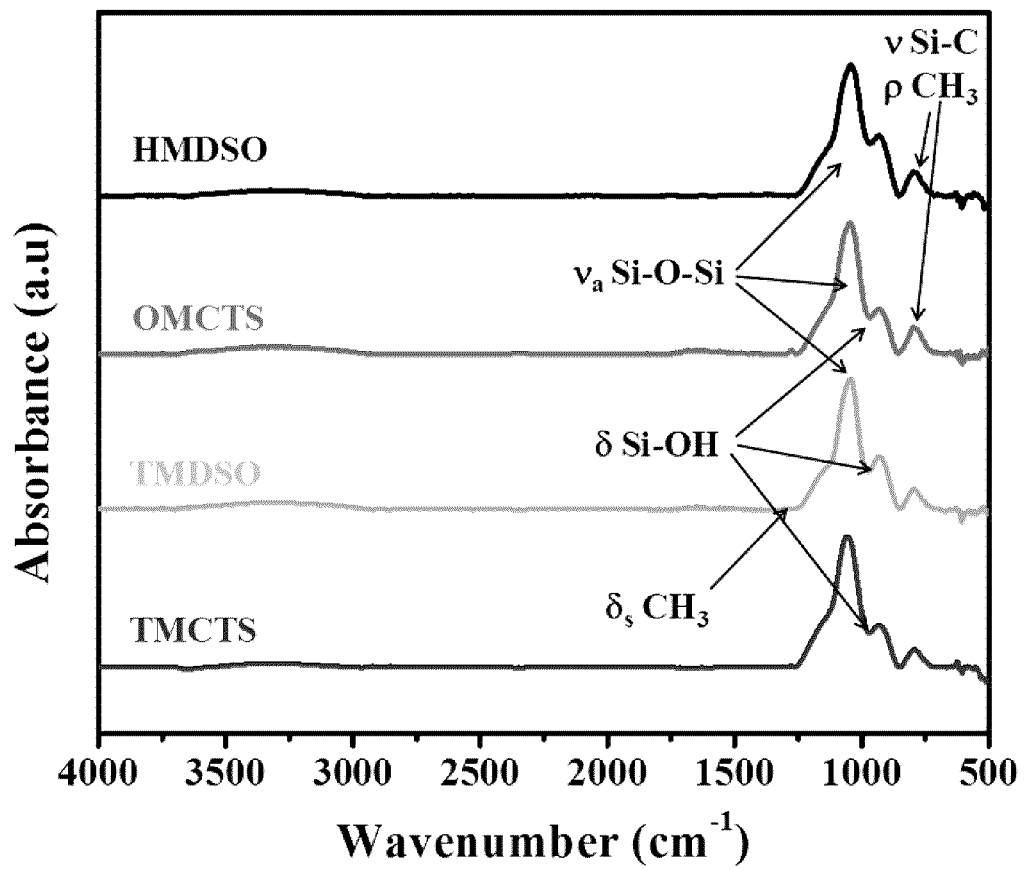
Figure 3C:
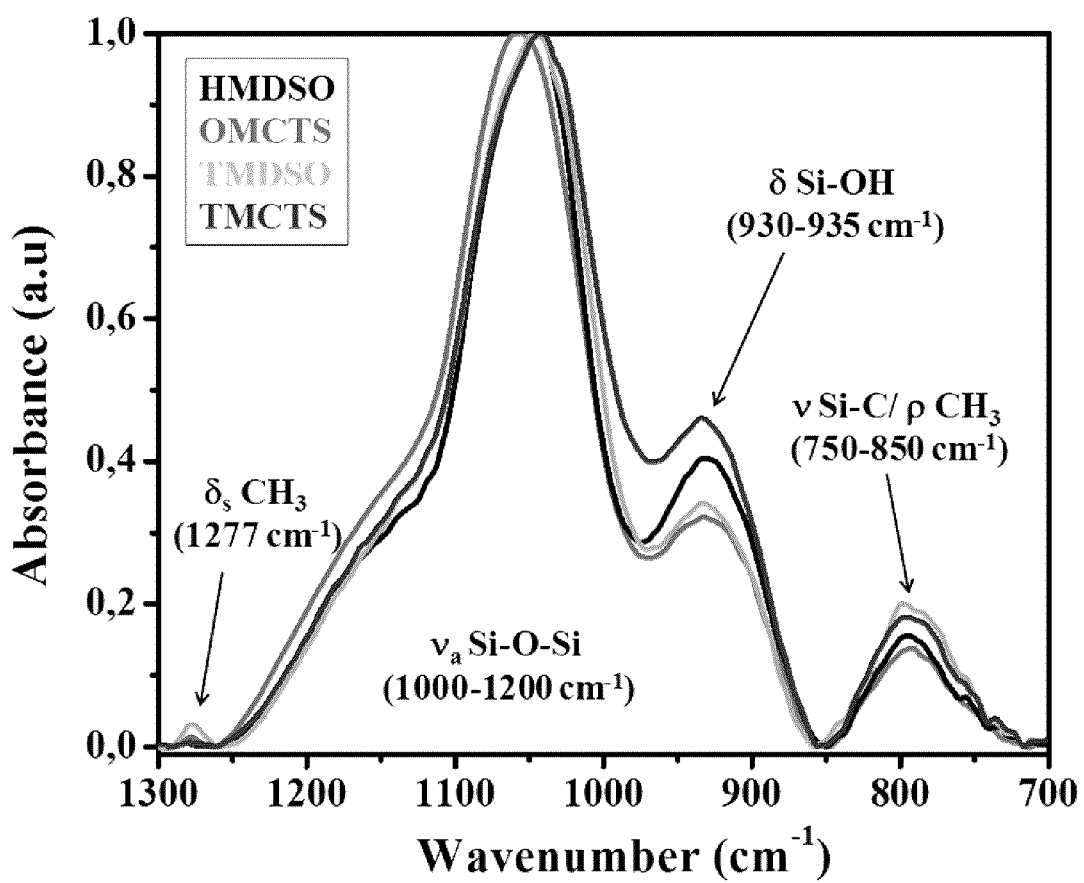
Figure 3D:
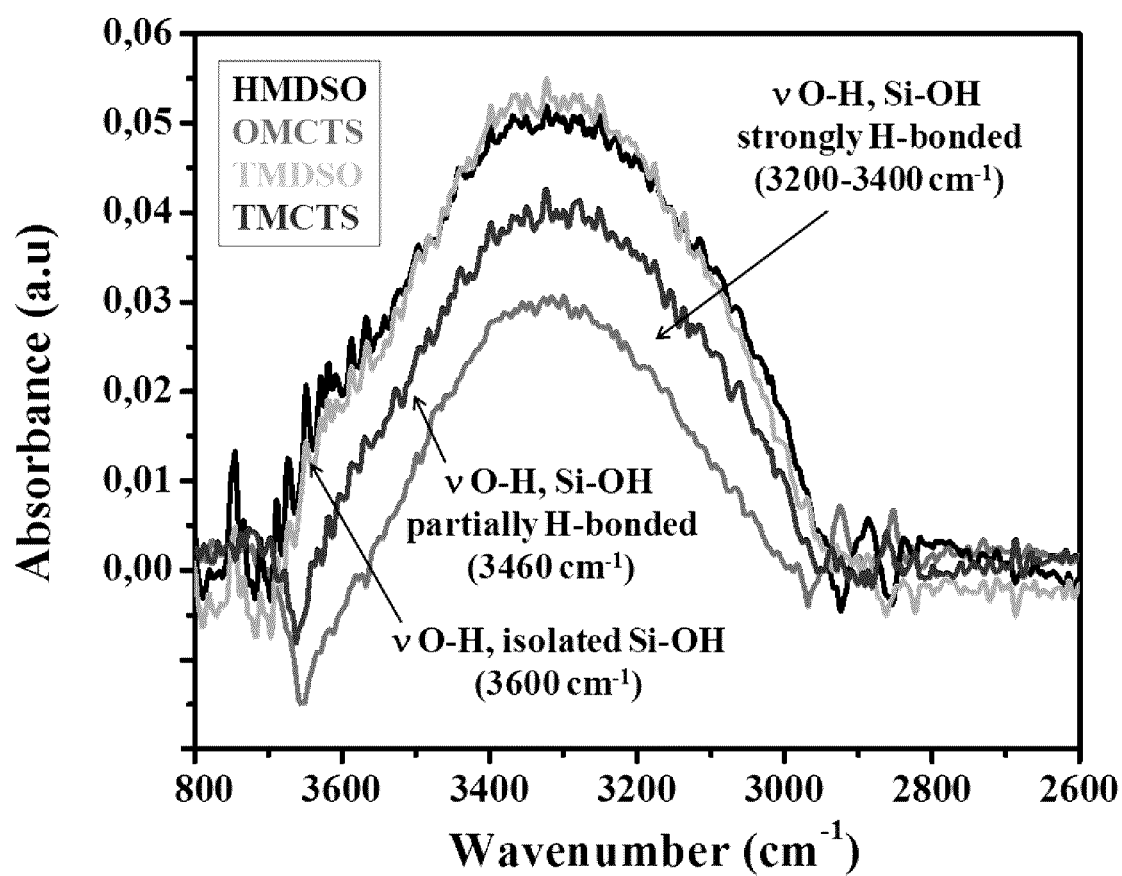
Figure 4A:
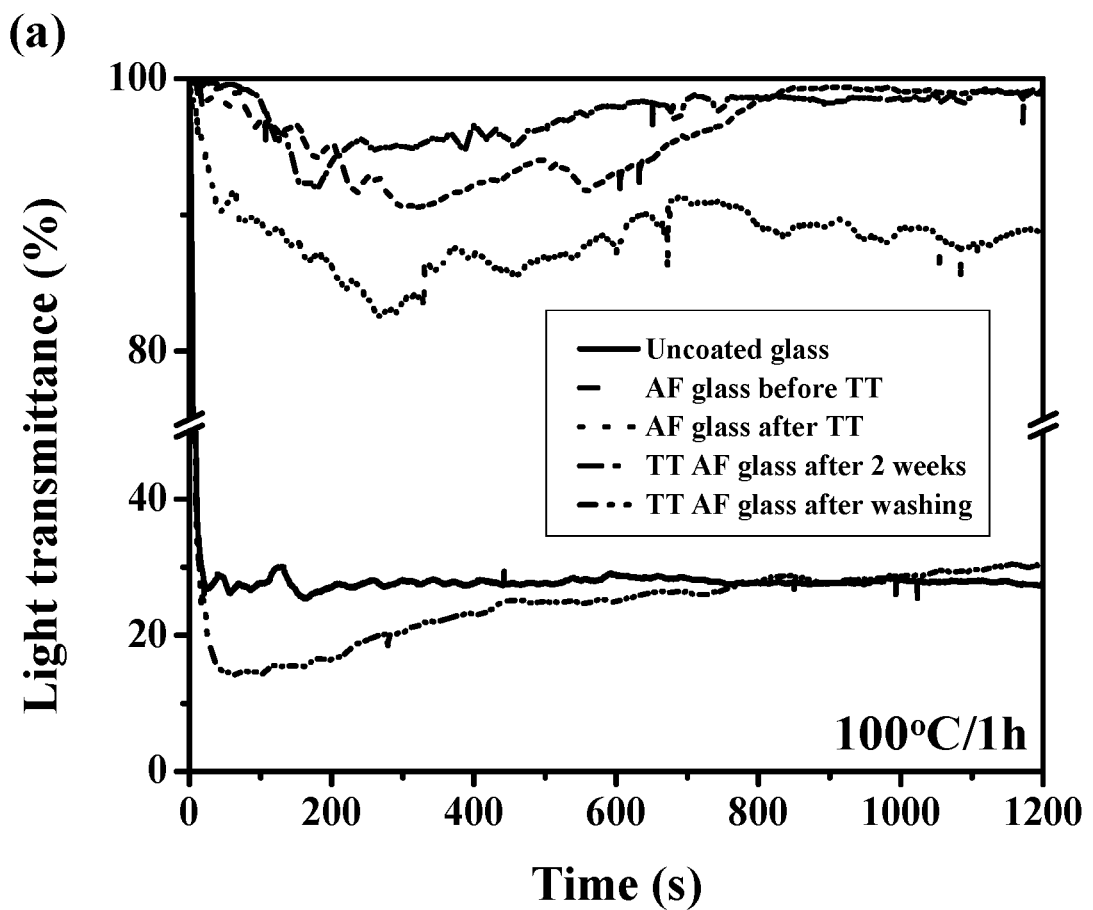
FIGS. 4(a)-(d) show the light transmittance behaviour of coated glasses following thermal treatments.
Figure 4B:
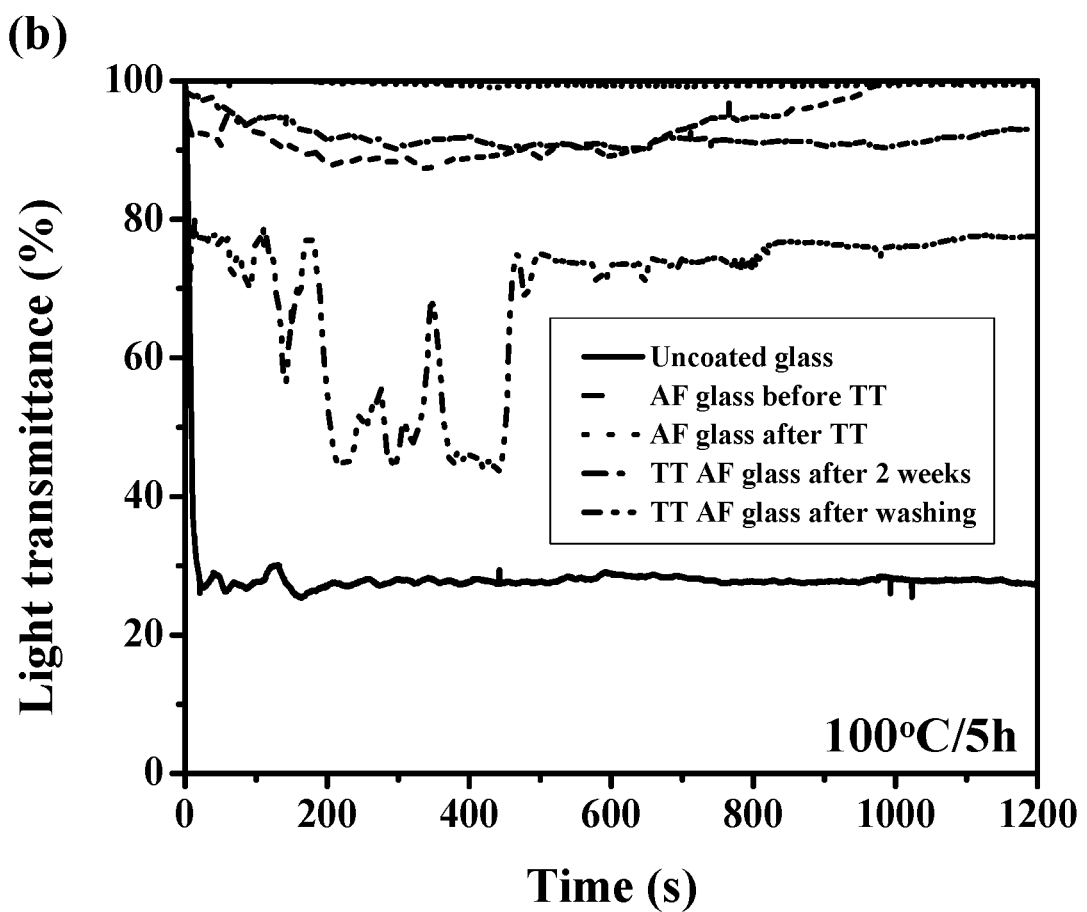
Figure 4C:
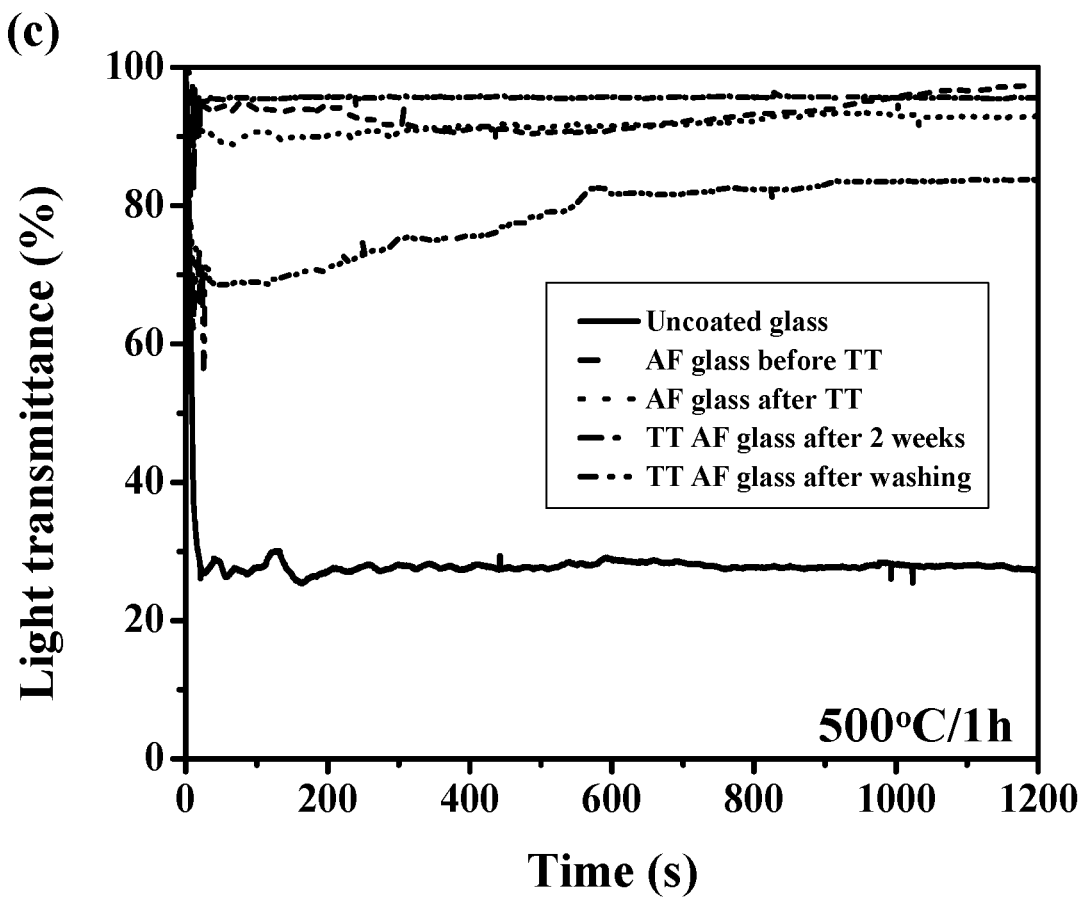
Figure 4D:
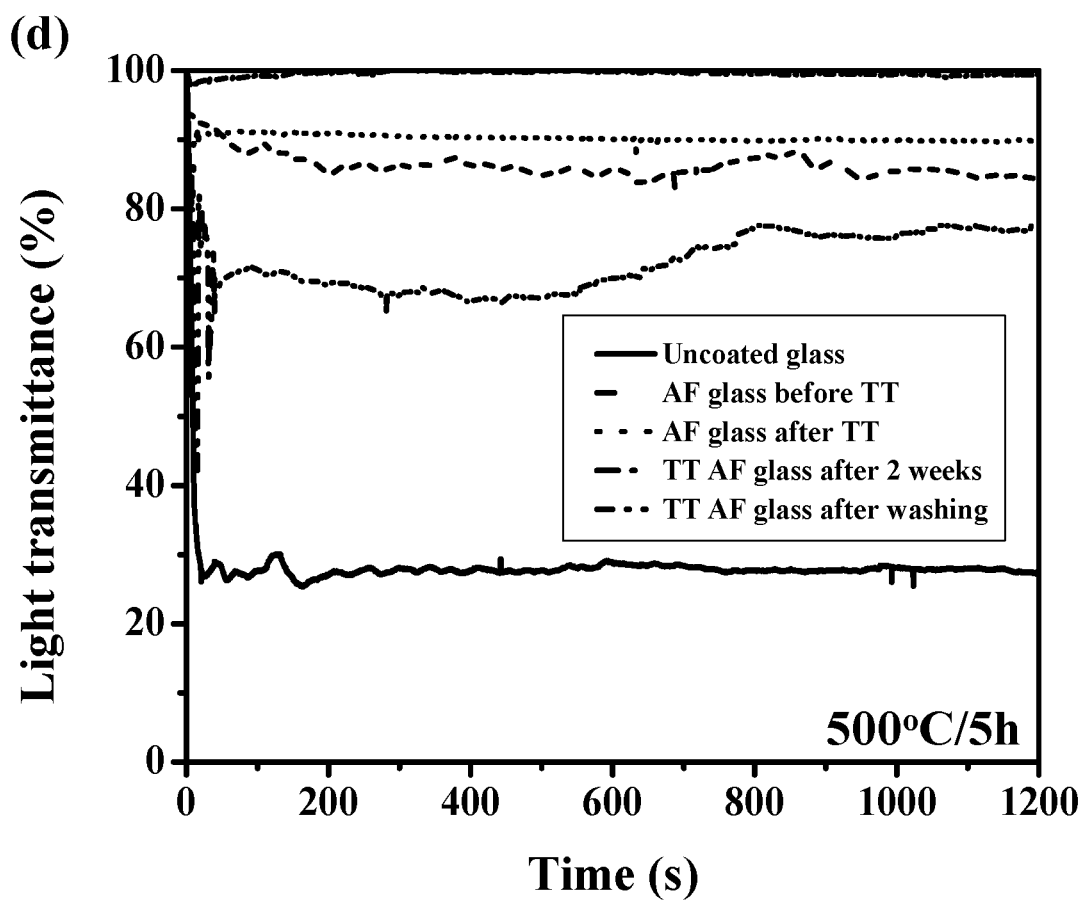

Coatings deposited on glass substrates using a N$_2$/N$_2$O atmospheric Townsend discharge exhibited a broad IR Si—O—Si absorption (1000-1200 cm$^{-1}$) accompanied by the emergence of a shoulder at ~1150 cm$^{-1}$, a typical feature of silica coatings deposited by plasma (FIG. 3c). Several studies suggest that the peak at ~1150 cm$^{-1}$ intimates the presence of cage-like entities in the coatings. In this regard, the inorganic signature of the thin film observed in the broad band ranging from 1000 to 1200 cm$^{-1}$ can be fitted with three (A. Grill, et al., J. Appl. Phys. 94 (2003) 3427; A. Grill, J. Appl. Phys. 93 (2003) 1785; A. Grill, et al., J. Appl. Phys. 94 (2003) 6697) or four components (D. D. Burkey, et al, J. Vac. Sci. Technol. A Vacuum, Surfaces, Film. 22 (2004) 61-70; C. Y. Wang, et al, Appl. Spectrosc. 55 (2001) 1347-1351; C. Y. Wang, et al, Appl. Spectrosc. 54 (2000) 209-213). IR features pertaining to C—H bonds in methyl groups remain visible on the deposited thin films. This means that the presence of oxidant species (i.e. N$_2$O), does not completely remove all of the carbon-containing functionalities from the coating. Thus, the bending vibrations in Si—(CH$_3$)$_x$ at 1255-1259 cm$^{-1}$ remained visible for all organosilicon coatings. Even though plasma-deposited films did not display a marked organic character, both the $v_a$ Si—O—Si peak position (1043-1057 cm$^{-1}$) and its full width at half maximum (FWHM≈250 cm$^{-1}$) reveal a coating structure considerably different from that of the stoichiometric SiO$_2$ (ASM at 1075-1080 cm$^{-1}$ and FWHM≈70 cm$^{-1}$ (P. González, et al, Appl. Surf. Sci. 54 (1992) 108-111.)). In addition, in the case of TMCTS- and TMDSO-based coatings, the absence of absorptions in the range of 2130-2170 cm$^{-1}$ indicate that coatings were devoid of Si—H bonds (FIG. 3b). Additional IR features were observed at 930-935 cm$^{-1}$ (typically assigned to the bending vibrational mode of Si—O in silanol groups). The small broad band ranging from 3000 to 3700 cm$^{-1}$ is also associated with the OH groups (P. F. McMillan, et al, Am. Mineral. 71 (1986) 772-778; R. McDonald, J. Phys. Chem. 62 (1958) 1168-1178). These hydrophilic functionalities, although undesired in applications where high-quality SiO$_2$ coatings are required, are key to conferring anti-fogging capability to glass samples. Minor absorption in the range of 1550-1750 cm$^{-1}$, most likely arising from the C=O bond stretching, intimates the presence of carbonyl-containing functionalities in the coatings, such as carboxyl (COOH), ester (COOR), or amide groups (CONH) (R. Reuter, et al, Appl. Phys. Lett. 101 (2012) 194104). That said, CN-related absorptions cannot be excluded, given that the C=N bond stretching also falls within the same frequency range. (R. Reuter—ibid)

TABLE 6

Principal IR absorption bands for siloxane precursors used in this study. ν = stretching, δ = bending, ρ = rocking, a = asymmetric, and s = symmetric.

| HMDSO | OMCTS | TMDSO | TMCTS | Vibrational mode | Comment |
|---|---|---|---|---|---|
| 2962 | 2962 | 2962 | 2968 | $\nu_a$ C—H$_3$ | in sp$^3$ CH$_3$ |
| 2902 | 2904 | 2903 | 2906 | $\nu_s$ C—H$_3$ | in sp$^3$ CH$_3$ |
|  |  | 2127 | 2165 | $\nu$ Si—H | in H—SiOSi |
| 1410 | 1412 | 1419 | 1406 | $\delta_a$ C—H$_3$ | in Si (CH$_3$)$_x$ |
| 1256 | 1259 | 1255 | 1259 | $\delta_a$ C—H$_3$ | in Si (CH$_3$)$_x$ |
| 1072 | 1061 | 1061 | 1063 | $\nu_a$ Si—O—Si | — |
|  |  | 906 |  | $\nu$ Si—C, $\rho$ CH$_3$ | in Si(CH$_3$)$_2$ |
|  |  | 877 | 865 | $\delta$ H—Si—O | in H—SiOSi |
| 849 |  |  |  | $\nu$ Si—C, $\rho$ CH$_3$ | in Si (CH$_3$)$_3$ |
|  |  | 831 |  | $\nu$ Si—C, $\rho$ CH$_3$ | in Si (CH$_3$)$_2$ |
| 756 | 804 | 769 | 754 | $\nu$ Si—C, $\rho$ CH$_3$ | in Si (CH$_3$)$_{1, 3}$ |
|  | 692 |  |  |  |  |
| 689 | 660 | 619 | 710 | $\nu_s$ Si—O—Si | — |
|  | 549 |  |  |  |  |

Atomic force microscopy analysis of the coatings deposited using N$_2$/N$_2$O plasma at atmospheric pressure in the presence of TMCTS, TMDSO, OMCTS, and HMDSO were obtained. In general terms, coatings were quite homogeneous and exhibited no evidence of major surface defects, such as pinholes or cracks. This is consistent with the homogeneous nature of the Townsend discharges employed in this research. Nonetheless, some differences in the morphology of surface features and roughness (R$_{rms}$ and R$_a$) were observed (Table 7). While OMCTS-, TMDSO-, and HMDSO-based coatings were very smooth at the microscale, considering the small R$_{rms}$ values (1.3-7 nm) for both 5×5 and 50×50 µm$^2$ areas, the island-like features with a higher aspect ratio observed on TMCTS-based coatings caused R$_{rms}$ to increase 19 nm. In either case, the plasma-deposited coatings were considerably rougher than the glass substrate, which revealed surface features in the 0.5-1.5 nm range.

TABLE 7

Root mean square roughness (R$_{rms}$), mean roughness (R$_a$), and deposition rates (DR) of plasma-deposited coatings on 5 × 5 and 50 × 50 µm$^2$ areas (VP: vapor pressure).

| Sample | R$_{rms}$ (nm) 5 × 5 µm$^2$ | R$_a$ (nm) | R$_{rms}$ (nm) 50 × 50 µm$^2$ | R$_a$ (nm) | DR (nm min$^{-1}$) | VP (Torr)/ 20-25° C. |
|---|---|---|---|---|---|---|
| TMCTS | 17.9 ± 0.7 | 14.1 ± 0.5 | 19 ± 1 | 14 ± 1 | 23 ± 2 | 7 |
| TMDSO | 6.76 ± 0.07 | 5.33 ± 0.05 | 4.9 ± 0.2 | 3.9 ± 0.2 | 6.8 ± 0.5 | 110 |
| HMDSO | 2.0 ± 0.1 | 1.42 ± 0.02 | 4 ± 2 | 3 ± 2 | 4.0 ± 0.2 | 42 |
| OMCTS | 1.32 ± 0.07 | 1.02 ± 0.05 | 7 ± 1 | 1.9 ± 0.9 | 1.6 ± 0.6 | 1 |
| Glass | 0.7 ± 0.2 | 0.5 ± 0.1 | 1.6 ± 0.5 | 1.1 ± 0.5 | — |  |

Deposition rates, which were estimated by dividing the thickness of the coatings by the deposition time, were shown to decrease as follows: TMCTS (23 nm min$^{-1}$)>TMDSO (6.8 nm min$^{-1}$)>HMDSO (4 nm min$^{-1}$)>OMCTS (1.6 nm min$^{-1}$). It is reasonable to assume that the observed differences in the growth rates cannot be due to changes in the concentration of the precursors in the discharge, as the amount of TMCTS, OMCTS, TMDSO, and HMDSO injected in the plasma was set at 10 ppm.

Interestingly, the surface roughness of the coatings appears to be linked to their deposition rates. Indeed, a possible factor accounting for the enhanced roughness observed in TMCTS-based coatings is the relatively high deposition rate compared to that of OMCTS-, TMDSO-, and HMDSO-based coatings. Siloxane precursors containing Si—H bonds in their structure (e.g., TMCTS and TMDSO) allowed for the preparation of coatings with enhanced deposition rates. It is believed that the labile nature of the Si—H bond ($\Delta H_{dissociation}$ Si—H<Si—C<Si—O) makes TMCTS more reactive than OMCTS, thus providing suitable justification for the higher deposition rates. In addition to the high reactivity of the Si—H bond, the four-membered siloxane ring in the TMCTS molecule is believed to be a contributing factor to the greater deposition rate. The Si—H bonds would preferentially break through collisions with the reactive oxygen species in the plasma, leading to the formation of "activated" siloxane rings. The as-formed entities would then react with each other to produce multiringed structures with high surface adsorption rate. Bearing in mind the surface morphology of the coatings, these arguments lead us to believe that these multiringed structures do not pack efficiently at the molecular level, unlike the species generated in the presence of OMCTS, TMDSO, and HMDSO in the plasma.

As shown in Table 7, for the same number of silicon atoms in the precursor, those with a greater vapor pressure allow for the deposition of coatings with higher deposition rates. Although it had previously been reported that a greater number of silicon atoms in the siloxane precursor might correlate with enhanced deposition rates (e.g. TMCTS vs TEOS this does not appear to be valid here, as a greater number of silicon atoms in the starting precursor did not translate to a higher deposition rate (compare OMCTS and TMDSO, HMDSO).

The resistance to fogging was evaluated by visual inspection by taking photographs of the samples immediately after they were brought back to ambient lab conditions. The degree of visibility through the coated glasses enables us to define their resistance to fogging by simply stating, good, regular, and poor anti-fogging performance. Table 8 summarizes the results of hot-fog testing by visual inspection of coated glasses following exposure to water at 80° C.

TABLE 8

Hot-fog test results

| Coating | Visibility over hot water | Visibility in air |
|---|---|---|
| TMCTS | Excellent | Excellent |
| OMCTS (comparative examples) | Poor | Poor |
| TMDSO (comparative examples) | Poor | Poor |
| HMDSO (comparative examples) | Poor | Poor |

It was observed that glass samples covered by TMCTS-based coatings maintain transparency when placed on an Erlenmeyer containing water at 80° C. Furthermore, TMCTS-coated glasses enabled an easy legibility of the letters behind them and remained optically clear when exposed to ambient conditions. Under the same conditions, the comparative examples OMCTS-, TMDSO-, and HMDSO-coated glasses provided a blurry view. Hot-fog testing revealed two important facts. First, the use of a cyclic siloxane containing Si—H groups such as TMCTS is required to provide glass samples with the anti-fogging feature; and second, glasses coated either with a fully methylated cyclic siloxane, such as OMCTS, or with acyclic siloxanes, such as TMDSO and HMDSO, do not defog even when they are brought back to room temperature.

In conclusion, the experiment clearly shows that TMCTS-based coatings provide anti-fog character to glass. In addition, the results indicate that a combination of characteristics produce coatings endowed with the anti-fogging feature.

Example 3) Stability of Anti-Fogging Coatings

In the following examples, TMCTS is used as the siloxane precursor. In this instance, the total flow rate of $N_2$ was set at 4 L min$^{-1}$ and the precursor concentration was set at 10 ppm. In all experiments, the [$N_2O$]/[precursor] ratio in the discharge was 50% greater than the stoichiometric one (Table 9). Stoichiometric [$N_2O$]/[precursor] ratios were calculated assuming the following reactions between the siloxane precursors and the $N_2O$ in the discharge:

TMCTS: [H(CH$_3$)SiO]$_4$+20 N$_2$O→20 N$_2$+4 CO$_2$+8 H$_2$O+4 SiO$_2$

TABLE 9

Amount of oxidant and precursor injected in the discharge. [X] indicates concentration of X.

| | [Precursor] (ppm) | [N$_2$O] (ppm) | [N$_2$O]/[precursor] |
|---|---|---|---|
| TMCTS | 10 | 300 | 30 |

The discharge was driven at 16 kV$_{pp}$ at a frequency of 6 kHz, which corresponds to a discharge power of 0.7 W/cm$^2$. The deposition time was set at 10 min. The displacement speed of glass samples was kept at 35 cm min$^{-1}$, i.e., the bottom electrode moving back and forth 50 times.

Several thermal treatments under a controlled atmosphere were applied to TMCTS-coated glasses to enhance mechanical robustness and impart a better adhesive coating/substrate. Effect of temperature (100 and 500° C.), treatment time (1 and 5 h), and the gas atmosphere (Ar and Ar/O$_2$, 2% vol/vol) on the anti-fogging performance was evaluated before and following thermal treatments.

Resistance to fogging of thermally treated TMCTS-coated glasses was also investigated following a washing treatment. To this end, samples were placed on a small mobile cart and then taken into a washing machine at 8 m min$^{-1}$. The washing process involved the following basic steps: (1) a water jet at 50-55° C. was projected above and below the coated glasses (pre-washing); (2) a second washing by water jets projections (50-55° C.) followed by washing with four rotating brushes, two of which were placed on the coating and the other two under the coated glass; (3) rinsing with a water jet at 50-55° C. followed by washing with two rotating brushes, one of which was placed on the coating and the other under the coated glass; and (4) fan drying (high-speed fan) at room temperature. Brushes rotating in 1700 rpm (revolutions per minute) were made of nylon fibers of either 0.15 or 0.3 mm in diameter, depending on whether they are in contact or not with the coated side, respectively.

Assessment of resistance to fogging of coated glasses was carried out before and following thermal treatments (TT). In addition, thermally treated TMCTS-coated glasses were also subjected to the washing protocol described above to evaluate the durability of the coatings and their anti-fogging performance when exposed to water vapor at 50° C. (ASTM F 659-06).

FIG. 4 displays the percentage of light transmitted as a function of time through the TMCTS-coated glasses treated at (a) 100° C. for 1 h, (b) 100° C. for 5 h, (c) 500° C. for 1 h, and (d) 500° C. for 5 h. (Solid line: uncoated glass, dashed line: coated glass before TT, dotted line: coated glass following TT, dash-dotted line: thermally treated coated glass following 15 days, dash-dotted-dotted line: thermally treated coated glass following three washing treatments).

With transmittance values well above 80% for more than 30 s, TMCTS-coated glasses featured excellent anti-fogging capacity before thermal treatment. Similarly, coated glasses displayed outstanding anti-fogging property following two weeks of exposure to (uncontrolled) room conditions and following thermal treatment. Based on these findings, it can therefore be concluded that the duration and temperature of thermal treatment barely alter the anti-fogging performance of coated glasses (compare dash-dotted, dashed, and dotted lines). Interestingly, increasing both parameters (temperature and duration of thermal treatment) either separately or in combination had a positive impact on the anti-fogging performance of thermally treated glasses subjected to industrial washing (compare dash-dotted-dotted lines in FIGS. 4a and 4b, 4a and 4c, and 4a and 4d). Further to this, washing was found to not compromise dramatically the anti-fogging performance (60%<Transmittance<80%), except from coated glasses shown in FIG. 4a, in which transmittance values were between 15 and 30% after 30 s of exposure to water vapor at 50° C.

To procure coatings with a longer-lasting anti-fogging performance once washed, thermal treatments were carried out under a controlled Ar atmosphere in the presence of a small amount of O$_2$ (2% v/v).

Figure 5A:
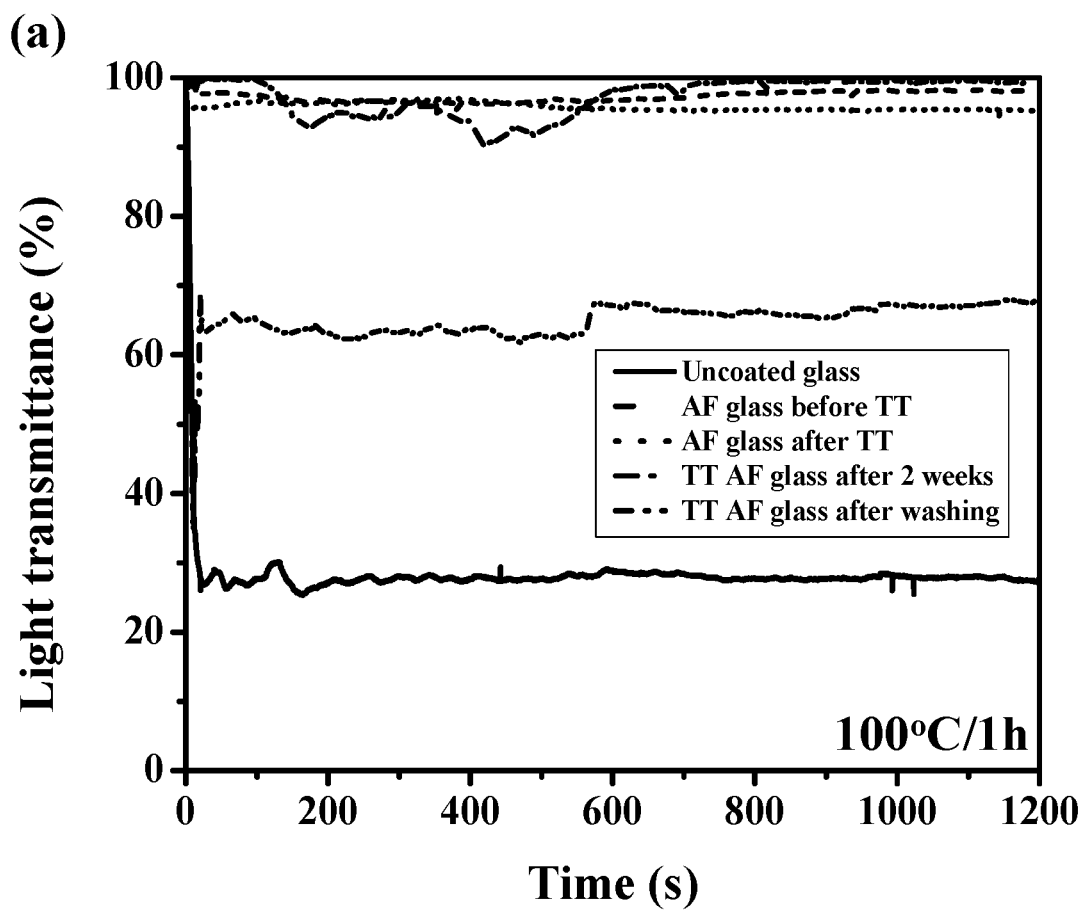
FIGS. 5(a)-(d) show the light transmittance behaviour of coated glasses following thermal treatments.
Figure 5B:
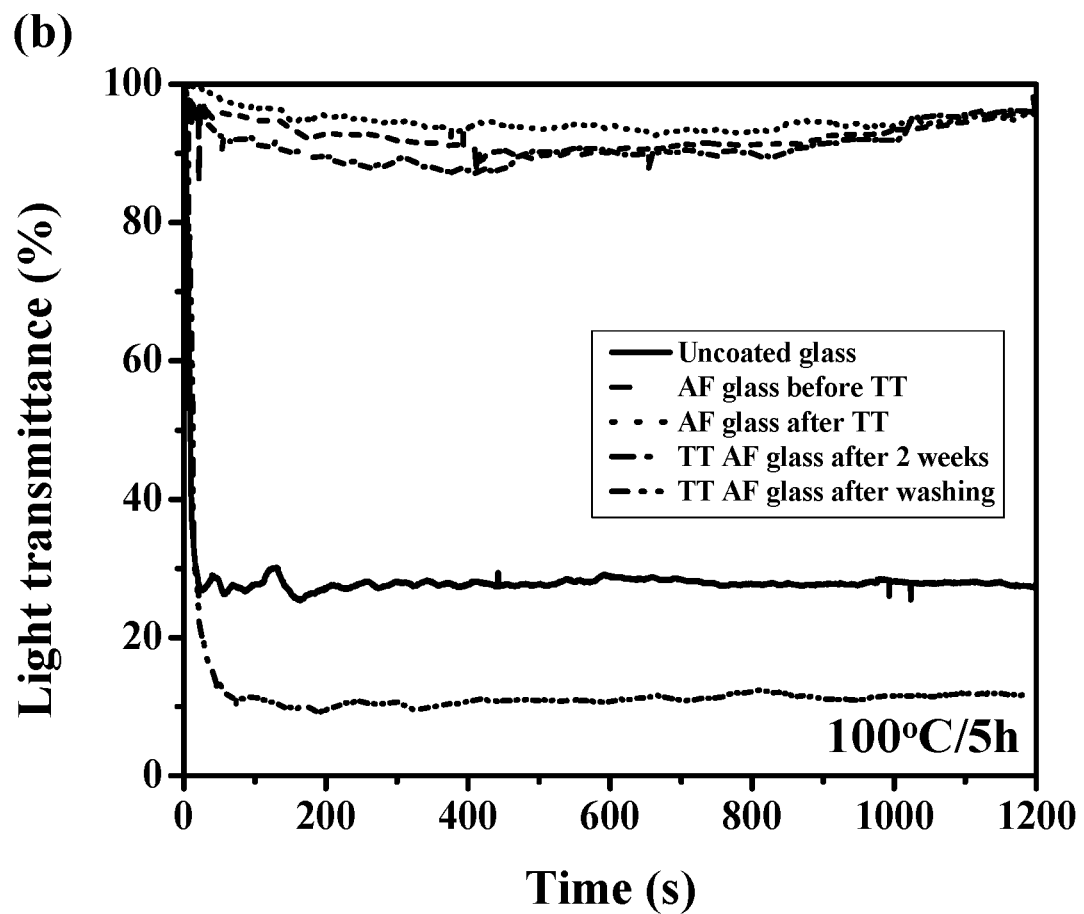
Figure 5C:
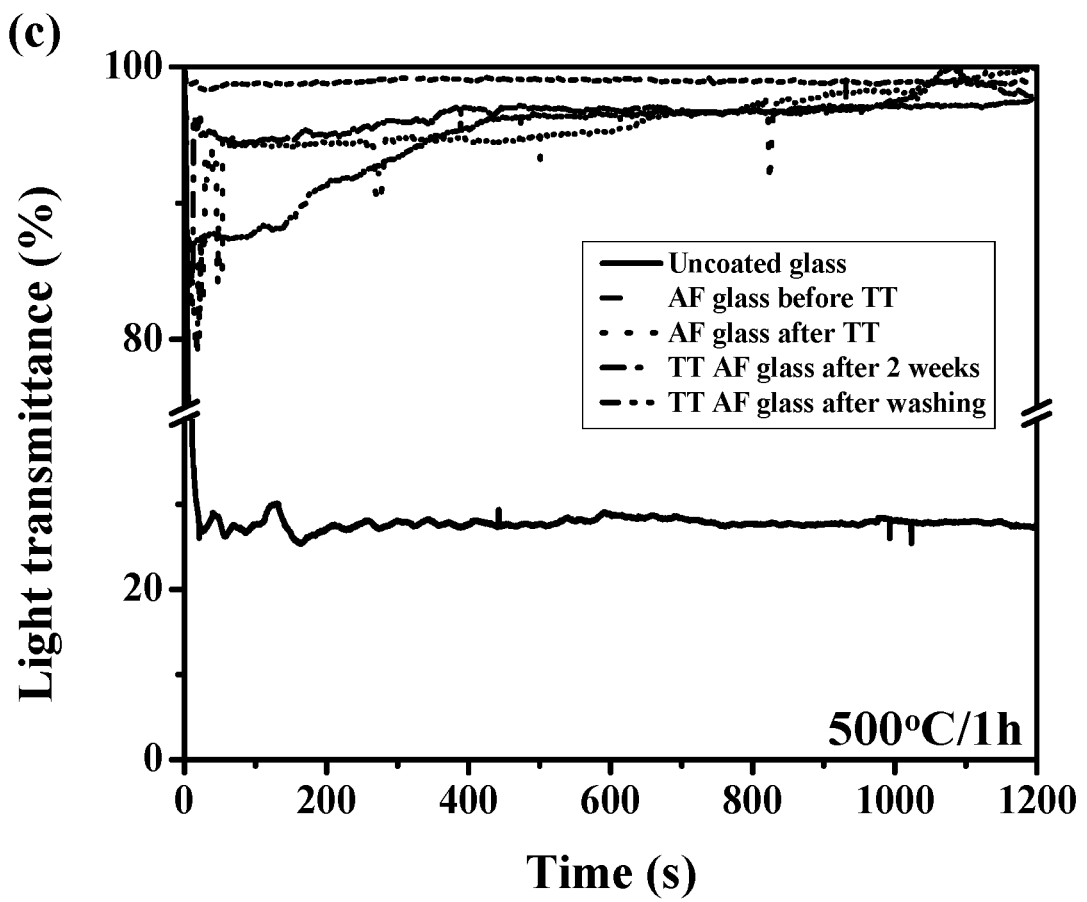
Figure 5D:
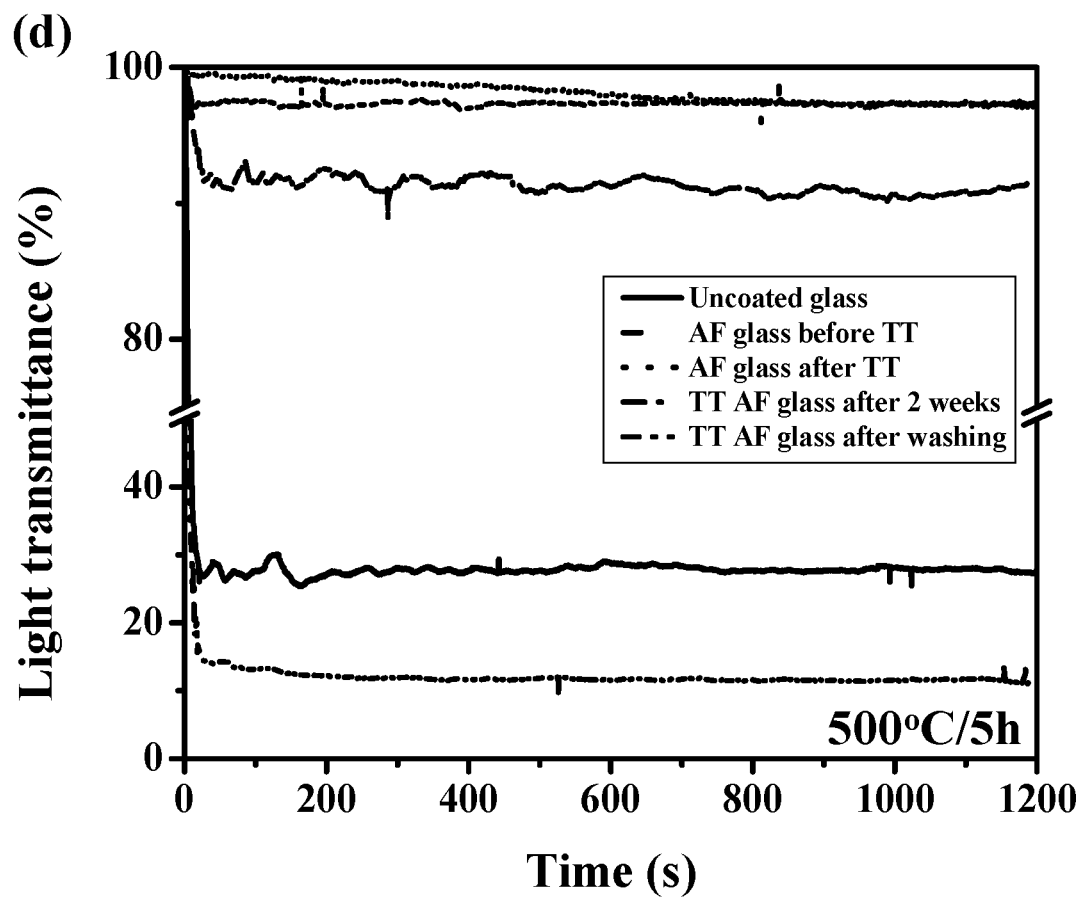
Figure 6:
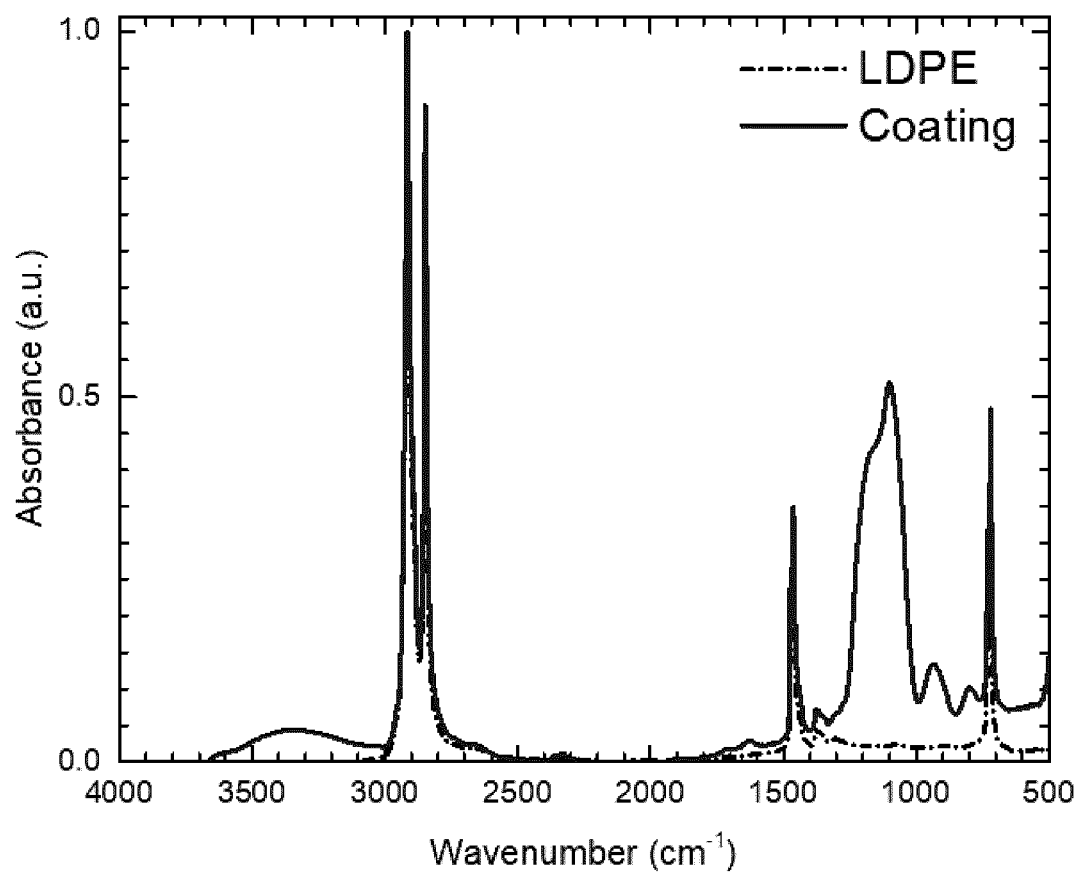
FIG. 6 ATR-FTIR spectra (Figure X) from plasma-treated PET and LDPE samples.

The ASTM F659-06 protocol evidenced superior anti-fogging performance in coated glasses before, following two weeks of exposure to (uncontrolled) room conditions, and after thermal treatment (Transmittance>80%) (compare dash-dotted, dashed, and dotted lines). As in the previous case, the duration and temperature of thermal treatment barely alter the anti-fogging performance of the TMCTS-coated glasses (compare dash-dotted, dashed, and dotted lines). However, unlike TT in pure Ar, the increase in both temperature and treatment time in combination did not result in coated glasses with better anti-fogging performance following washing treatment (compare FIGS. 5a and 5d). Similarly, an increase in the duration of thermal treatment did not correlated with enhanced anti-fogging capacity (compare FIGS. 5a and 5b). In this case, the best anti-fogging performance was attained in coated glasses treated at 500° C. for 1 h. A possible explanation for the anti-fogging behavior found in this case is that following thermal treatment at 500° C. under an oxidant atmosphere, coatings best adhered to the substrate and were mechanically robust. Although further analyses are required to verify this, it may explain why the anti-fogging performance of thermally treated samples was not compromised despite aggressive washing treatment.

FIG. 5 displays the percentage of light transmitted as a function of time through the TMCTS-coated glasses treated at (a) 100° C. for 1 h, (b) 100° C. for 5 h, (c) 500° C. for 1 h, and (d) 500° C. for 5 h. (Solid line: uncoated glass, dashed line: coated glass before TT, dotted line: coated glass following TT, dash-dotted line: thermally treated coated glass following 15 days, dash-dotted-dotted line: thermally treated coated glass following three washing treatments).

Example 4) Plasma Deposition Under Different Conditions

Using a syringe pump (Fisherbrand™, Thermo Fisher Scientific, Runcorn, Cheshire, UK) coupled to a nebulizer (Mira Mist CE™, Burgener Research Inc., Mississauga, ON, Canada), a TMCTS microdroplets were injected into the reactor chamber suspended in a flow of $N_2$ at 1 L min$^{-1}$ through an aerosol delivery line. To assist TMCTS nebulization, the aerosol delivery line was heated to 40° C. Similarly, $N_2O$ (oxidizing gas) were carried to the reactor chamber by a flow of $N_2$ at 3 L min$^{-1}$ through a second gas delivery line. The flow rate of $N_2$ and $N_2O$ was measured using mass flow meters (EL-FLOW™, Bronkhorst™, Ruurlo, Netherlands). The deposition time was set at 10 min. During coating deposition, the speed at which glass samples moved back and forth (i.e., sample scroll speed) ranged from 17.5 to 52.5 cm min$^{-1}$.

Table 10 below shows that anti-fogging properties were obtained at the lowest and highest sample scroll speed (entries 1-2), as well as an intermediate scroll speed with respectively lower of higher [$N_2O$]/[TMCTS] ratios (entries 3-4). Further, a reduced dissipated power at 0.5 W cm$^{-2}$ provided anti-fogging properties, independently of whether the speed of treatment was 17.5 or 52.5 cm min$^{-1}$ (entries 5-6).

TABLE 10

Deposition parameters used for the fabrication of plasma coatings and antifogging properties of the coated glasses.

| Entry | Dissipated power (W cm−2) | [N₂O]/[TMCTS] ratio | Sample scroll speed (cm min−1) | Anti-fogging properties (Y/N) |
|---|---|---|---|---|
| 1 | 0.7 | 30 | 17.5 | Y |
| 2 | 0.7 | 30 | 52.5 | Y |
| 3 | 0.7 | 20 | 35 | Y |
| 4 | 0.7 | 40 | 35 | Y |
| 5 | 0.5 | 40 | 17.5 | Y |
| 6 | 0.5 | 40 | 52.5 | Y |
| 7 | 0.5 | 30 | 35 | Y |

The XPS methodology described above was used to characterize the chemical surface composition of coated glasses under a dissipated power of 0.5 W cm$^{-2}$ and different [$N_2O$]/[TMCTS] ratios and sample scroll speed. The analysis is summarized in Table 11 and shows that the coatings are composed of silicon, oxygen, carbon, and nitrogen. The O/Si ratios above 2 (O/Si ratio in $SiO_2$) substantiate the incorporation of oxygen from the plasma phase and concur with the presence of the Si—OH groups in the coatings.

TABLE 11

Surface composition of the coatings.

| Entry (Papier) | Si2p | O1s | C1s | N1s | O/Si | C/Si | N/Si |
|---|---|---|---|---|---|---|---|
| 7 [N₂O]/[TMCTS]: 30 Sample scroll speed: 35 cm min⁻¹ | 27.8 ± 0.5 | 67 ± 1 | 5.6 ± 0.9 | 0.11 ± 0.03 | 2.38 ± 0.07 | 0.20 ± 0.03 | 0.004 ± 001 |
| 6 [N₂O]/[TMCTS]: 40 Sample scroll speed: 52.5 cm min⁻¹ | 27.5 ± 0.5 | 66 ± 3 | 5.8 ± 0.4 | 0.2 ± 0.2 | 2.4 ± 0.1 | 0.21 ± 0.09 | 0.007 ± 0.007 |
| [N₂O]/[TMCTS]: 20 Sample scroll speed: 17.5 cm min⁻¹ | 27 ± 1 | 63.1 ± 0.8 | 9 ± 1 | 0.8 ± 0.4 | 2.33 ± 0.1 | 0.33 ± 0.05 | 0.03 ± 0.02 |

(R = [N₂O]/[TMCTS], *atomic percentage of TMCTS).

Example 5) Plasma Deposition of Anti-Fog Coating on Plastic Substrates

In the following example, TMCTS was used as the siloxane precursor. Deposition was realized on PET and LDPE samples. In all experiments, the [$N_2O$]/[TMCTS] ratio was 50% greater than the stoichiometric one (Table 9). The discharge was driven at 28 kV$_{pp}$ at a frequency of 6 kHz, which corresponds to a discharge power of 0.5 W/cm$^2$. The thickness of plasma-deposited coatings was about 50 nm.

ATR-FTIR spectra (Figure X) from plasma-treated PET and LDPE samples confirmed deposition of an organosilicon coating with an IR signature similar to the one achieved on plasma-treated glass samples (see FIG. 3 and Table 6).

Assessment of resistance to fogging of plasma-coated PET and LDPE samples was carried out before and following plasma treatments. Hot-fog testing was realized by visual inspection of the samples following exposure to water at 80° C. Samples were fixed side-by-side to a metal plate placed over a heated water bath to produce fog on both treated and untreated surfaces simultaneously. The results showed that while PET and LDPE revealed significant fogging before plasma treatment, TMCTS-coated samples featured excellent anti-fogging capacity after plasma treatment.

The invention claimed is:

1. An anti-fog coating comprising a partially carbonaceous, nitrogenated, and overoxidized silica composition, wherein the anti-fog coating comprises from 0.08 to 0.8 atomic percent of nitrogen, and wherein said partially carbonaceous, nitrogenated, and overoxidized silica composition is characterized by the formula $Si_xO_yC_zN_w$:H wherein $3>y/x>2$; $z/x>0$; and $w/x>0$ and by having a root mean square (Rims) roughness of more than 15 nm under atomic force microscopy (AFM).

2. The anti-fog coating of claim 1, wherein y/x is within the range of 2-2.7 and z/x is within the range of 0.1-0.6; and w/x is within the range of 0.002 to less than 0.03.

3. The anti-fog coating of claim 1, wherein the anti-fog coating has a water contact angles (WCA) of less than about 55 degrees.

4. The anti-fog coating of claim 3, wherein the anti-fog coating has a WCA of about 5-10 degrees.

5. A coated substrate comprising a substrate and an anti-fog coating thereon, wherein said anti-fog coating is as defined in claim 1.

6. A process for producing an anti-fog coating as defined in claim 1 comprising
   i) providing a coatable surface of a substrate;
   ii) producing a plasma by exposing a carrier gas under dielectric barrier discharge (DBD) in Townsend's mode at atmospheric pressure;
   iii) exposing said surface to said plasma;
   wherein said carrier gas is further comprising an oxidant and a cyclic siloxane;
   wherein said cyclic siloxane is of formula:

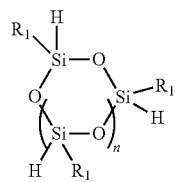

wherein each R1 is independently a straight C1-C3 alkyl, or a branched or cyclic C3 alkyl;
n is the integer 1 or 2.

7. The process of claim 6, wherein said discharge has a dissipated power of at least about 0.1 W cm$^{-2}$.

8. The process of claim 6, wherein said discharge has a dissipated power from about 0.3 to about 0.7 W cm$^{-2}$.

9. The process of claim 6, wherein each R1 in the cyclic siloxane is independently selected from a straight C1-C3 alkyl.

10. The process of claim 6, wherein each R1 in the cyclic siloxane is methyl.

11. The process of claim 6, wherein n in the cyclic siloxane is the integer 1.

12. The process of claim 6, wherein the cyclic siloxane is tetramethylcyclotetrasiloxane (TMCTS).

13. The process of claim 6, wherein the carrier gas and oxidant gas is a mixture providing a homogenous (or diffuse) dielectric barrier discharge in Townsend's mode at atmospheric pressure.

14. The process of claim 6, wherein the carrier gas is nitrogen ($N_2$).

15. The process of claim 6, wherein the oxidant is nitrous oxide ($N_2O$).

16. The process of claim 6, wherein the carrier gas and oxidant gas is a mixture selected from $N_2/O_2$, $N_2/N_2O$, and air.

17. The process of claim 6, wherein a ratio of the concentration of oxidant/concentration cyclic siloxane, such as [$N_2O$]/[TMCTS], is equal to or greater than about 10.

18. The process of claim 6, wherein said substrate is comprising polymers, glass, ceramics, composites and combinations thereof.

19. The process of claim 6, wherein said substrate is glass.

20. The process of claim 6, wherein said substrate is a polymer substrate comprising polycarbonate, polyethylene, polypropylene, polystyrene, poly(ethylene terephtalate), or poly(methyl methacrylate).

* * * * *